(12) United States Patent
Kim et al.

(10) Patent No.: US 10,062,786 B2
(45) Date of Patent: Aug. 28, 2018

(54) SEMICONDUCTOR DEVICE AND METHOD FOR FABRICATING THE SAME

(71) Applicant: Samsung Electronics Co., Ltd., Suwon-si (KR)

(72) Inventors: Ju-Hyun Kim, Hwaseong-si (KR); Ho-Young Kim, Seongnam-si (KR); Se-Jung Park, Hwaseong-si (KR); Bo-Un Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 124 days.

(21) Appl. No.: 15/168,694

(22) Filed: May 31, 2016

(65) Prior Publication Data

US 2016/0365453 A1 Dec. 15, 2016

(30) Foreign Application Priority Data

Jun. 10, 2015 (KR) .................. 10-2015-0081785

(51) Int. Cl.
| | |
|---|---|
| *H01L 27/088* | (2006.01) |
| *H01L 29/423* | (2006.01) |
| *H01L 29/66* | (2006.01) |
| *H01L 29/78* | (2006.01) |
| *H01L 21/762* | (2006.01) |

(52) U.S. Cl.
CPC .... *H01L 29/7856* (2013.01); *H01L 21/76229* (2013.01); *H01L 21/76232* (2013.01); *H01L 27/0886* (2013.01); *H01L 29/4238* (2013.01); *H01L 29/42376* (2013.01); *H01L 29/66795* (2013.01); *H01L 29/7854* (2013.01)

(58) Field of Classification Search
CPC .................................................. H01L 29/7856
See application file for complete search history.

(56) References Cited

U.S. PATENT DOCUMENTS

| | | |
|---|---|---|
| 8,431,466 B2 | 4/2013 | Lin et al. |
| 8,461,008 B2 | 6/2013 | Cho |
| 8,541,286 B2 | 9/2013 | Park |
| 8,723,271 B2 | 5/2014 | Yuan et al. |
| 8,835,268 B2 | 9/2014 | Sudo |
| 8,853,037 B2 | 10/2014 | Cho |
| 2004/0245596 A1 | 12/2004 | Sugihara |
| 2013/0244387 A1* | 9/2013 | Cho ................. H01L 21/76224 438/283 |

(Continued)

*Primary Examiner* — Raj R Gupta
(74) *Attorney, Agent, or Firm* — Onello & Mello, LLP

(57) ABSTRACT

A semiconductor device includes a first fin-type pattern on a substrate, having a first sidewall and a second sidewall opposed to each other; a first trench formed in contact with the first sidewall; a second trench formed in contact with the second sidewall; a first field insulating layer partially filling the first trench; and a second field insulating layer partially filling the second trench and a second field insulating layer partially filling the second trench. The second field insulating layer includes a first region and a second region disposed in a sequential order starting from the second sidewall, an upper surface of the second region being higher than an upper surface of the first field insulating layer. The device further includes a gate electrode on the first fin-type pattern, the first field insulating layer and the second field insulating layer, the gate electrode intersecting the first fin-type pattern and overlapping the second region.

20 Claims, 34 Drawing Sheets

(56) References Cited

U.S. PATENT DOCUMENTS

2013/0277757 A1* 10/2013 Yuan ................ H01L 21/76224
　　　　　　　　　　　　　　　　　　　　　　257/386
2015/0017781 A1　　1/2015 Lin et al.
2016/0148998 A1* 5/2016 Wu .................... H01L 29/0649
　　　　　　　　　　　　　　　　　　　　　　257/369

* cited by examiner

1300

SEMICONDUCTOR DEVICE AND METHOD FOR FABRICATING THE SAME

CROSS-REFERENCE TO RELATED APPLICATION

This application claims priority from Korean Patent Application No. 10-2015-0081785 filed on Jun. 10, 2015 in the Korean Intellectual Property Office, and all the benefits accruing therefrom under 35 U.S.C. 119, the contents of which in its entirety are herein incorporated by reference.

FIELD OF INVENTION

Embodiments of the inventive concepts relate to a semiconductor device and a method for fabricating the same. More particularly, embodiments of the inventive concepts relate to a semiconductor device and a method for fabricating the same having decreased effective capacitance, thus enhancing AC performance and reliability of the semiconductor device.

BACKGROUND

The multigate transistor has been suggested as one of the scaling technologies to increase the density of semiconductor devices, in which a silicon body in a fin shape is formed on a substrate, with a gate then being formed on a surface of the silicon body.

The multigate transistor facilitates scaling, as it uses a three-dimensional channel. Further, current control capability can be enhanced without requiring increased gate length of the multigate transistor. Furthermore, the multigate transistor makes it possible to effectively suppress short channel effect (SCE), which is the phenomenon that results in the electric potential of the channel region being influenced by the drain voltage.

SUMMARY

Embodiments of the inventive concepts may provide a semiconductor device having decreased capacitance of a gate electrode resulting from increasing a height of a deep trench portion.

Embodiments of the inventive concepts may also provide a method for fabricating a semiconductor device having decreased capacitance of a gate electrode resulting from increasing a height of a deep trench portion.

The objectives are not limited to those mentioned above, and other objectives that are not mentioned above may be clearly understandable to those skilled in the art based on the description provided below.

In accordance with aspects of the inventive concept, there is provided a semiconductor device, comprising a first fin-type pattern on a substrate, comprising a first sidewall and a second sidewall opposed to each other, a first trench formed in contact with the first sidewall, a second trench formed in contact with the second sidewall, a first field-insulating layer partially filling the first trench, a second field-insulating layer partially filling the second trench, and comprising a first region and a second region disposed in a sequential order starting from the second sidewall, an upper surface of the second region being higher than an upper surface of the first field-insulating layer and a gate electrode on the first fin-type pattern, the first field-insulating layer and the second field-insulating layer, the gate electrode intersecting the first fin-type pattern and overlapping the second region.

In various embodiments, a contact between the upper surface of the first region of the second field-insulating layer and the first fin-type pattern is lower than the upper surface of the second region.

In various embodiments, the second field-insulating layer further comprises a third region in contact with the second region, and an upper surface of the third region is lower than the upper surface of the second region.

In various embodiments, a bottom surface of the first region is higher than a bottom surface of the second region.

In various embodiments, a width of the second region is greater than the width of the first region.

In various embodiments, the upper surface of the second region is higher than the upper surface of the first region.

In various embodiments, an uppermost portion of the upper surface of the second field-insulating layer is located at the second region.

In various embodiments, a contact between the upper surface of the second field insulating layer and the first fin-type pattern is higher than the upper surface of the first region.

In various embodiments, the semiconductor device may further comprise a second fin-type pattern in contact with the second-field insulating layer, and in an opposite direction from the first fin-type pattern with reference to the second-field insulating layer.

In various embodiments, a contact between the upper surface of the second field-insulating layer and the second fin-type pattern is lower than the upper surface of the second region.

In various embodiments, the semiconductor device may further comprise a third fin-type pattern in contact with the first field-insulating layer, and in an opposite direction from the first fin-type pattern with reference to the first field-insulating layer.

In various embodiments, a gap between the first and the second fin-type patterns is wider than a gap between the first and the third fin-type patterns.

In various embodiments, the gate electrode intersects the second and the third fin-type patterns.

In various embodiments, the upper surface of the first fin-type pattern is lower than an uppermost portion of the upper surface of the second field-insulating layer.

According to other aspects of the present inventive concept, there is provided a semiconductor device, comprising a first and a second fin-type patterns spaced from each other, a first trench between the first and the second fin-type patterns, spacing the first and the second fin-type patterns from each other, a field-insulating layer formed within the first trench, in contact with sidewalls of the first and the second fin-type patterns, respectively and a gate electrode formed on the first fin-type pattern, the second fin-type pattern, and the field-insulating layer, wherein the field insulating layer comprises a first region and a second region, and an upper surface of the first region is lower than an upper surface of the second region.

In various embodiments, the first region is disposed on both sides of the second region, the first region is in contact with the first fin-type pattern and the second fin-type pattern, and the second region is not in contact with the first and the second fin-type patterns.

In various embodiments, a thickness of the gate electrode overlapping the second region is less than a thickness of the gate electrode overlapping the first region.

In various embodiments, a contact between the upper surface of the field-insulating layer and the first fin-type pattern is higher than a portion of the upper surface of the first region.

In various embodiments, a contact between the upper surface of the field insulating layer and the second fin-type pattern is higher than a portion of the upper surface of the first region.

In various embodiments, the contacts between the upper surface of the field-insulating layer and the first and the second fin-type patterns are lower than the upper surface of the second region.

In various embodiments, the semiconductor device may further comprise a second trench formed in an opposite direction from the first trench with reference to the first fin-type pattern.

In various embodiments, a width of the second trench is less than a width of the first trench.

In various embodiments, a bottom surface of the second trench is higher than a bottom surface of the first trench.

In various embodiments, a bottom surface of the first region is higher than a bottom surface of the second region.

In various embodiments, a stepped region is formed between the bottom surface of the second region and the bottom surface of the first region.

According to still other aspects of the present inventive concepts, there is provided a semiconductor device, comprising a first, second and third fin-type patterns spaced from each other, a first trench between the first and the second fin-type patterns, spacing the first and the second fin-type patterns from each other, a second trench between the second and the third fin-type patterns, spacing the second and the third fin-type patterns from each other, a first field-insulating layer partially filling the first trench, a second field-insulating layer partially filling the second trench and a gate electrode formed on the first fin-type pattern, the second fin-type pattern, and the first and the second field-insulating layers, wherein a first region of a lower surface of the gate electrode that overlaps the first-insulating layer, is higher than a second region overlapping the second-insulating layer.

In various embodiments, a width of the first trench is greater than a width of the second trench.

In various embodiments, a gap between the first and the second fin-type patterns is wider than a gap between the second and the third fin-type patterns.

In various embodiments, an uppermost lost portion of the lower surface of the gate electrode is located at the first region.

In various embodiments, the gate electrode is one single integrated structure.

In various embodiments, the first, second and third fin-type patterns extend in a first direction, and the gate electrode extends in a second direction, which is different from the first direction.

According yet other aspects of the present inventive concepts, there is provided a semiconductor device, comprising a fin-type pattern comprising a first sidewall and a second sidewall opposed to each other, a first trench of a first depth, formed in contact with the first sidewall, a second trench of a second depth, formed in contact with the second sidewall, a third trench directly adjacent to the second trench, and formed deeper than the second depth, a first field-insulating layer partially filling the first trench, a second field-insulating layer partially filling the second trench and the third trench, wherein an upper surface of the second field-insulating layer overlapping the second trench is lower than the upper surface of the second field-insulating layer overlapping the third trench and a gate electrode on the fin-type pattern, the first field-insulating layer and the second field-insulating layer, the gate electrode overlapping the third trench.

According to yet other aspects of the present inventive concepts, there is provided a semiconductor device, comprising a fin-type pattern on a substrate, comprising a first sidewall and a second sidewall opposed to each other, a first trench formed in contact with the first sidewall, a second trench formed in contact with the second sidewall, a first field-insulating layer partially filling the first trench, a second field-insulating layer partially filling the second trench and a gate electrode overlapping the first and the second trenches, and fixated on the fin-type pattern, and the first and the second field-insulating layers, wherein an upper surface of the first field-insulating layer is lower than a boundary that connects a contact between the upper surface of the first field-insulating layer and the fin-type pattern, with a contact between the upper surface of the second field-insulating layer and the fin-type pattern, and an upper surface of the second field-insulating layer comprises a portion which is higher than the boundary.

According to yet other aspects of the present inventive concepts, there is provided a method for fabricating a semiconductor device, comprising forming a plurality of fin-type patterns protruding on a substrate and spaced from each other, and a first trench spacing the plurality of fin-type patterns, filling the first trench with a first field-insulating layer, respectively, forming a stopper layer on the plurality of fin-type patterns and the first field insulating layer, forming a second trench by partially etching the plurality of fin-type patterns, the stopper layer, and the first-insulating layer, forming a second field-insulating layer filling the second trench, removing the stopper layer, thus exposing a side surface of the second field-insulating layer which protrudes higher than the first field-insulating layer, etching the first and the second field-insulating layers, so that an upper portion of the fin-type pattern protrudes higher than the first field-insulating layer and forming a gate electrode on the fin-type pattern, the first field-insulating layer and the second field-insulating layer, the gate electrode intersecting the fin-type patterns.

In various embodiments, a width of the first trench is greater than a width of the second trench.

In various embodiments, a bottom surface of the second trench is lower than a bottom surface of the first trench.

In various embodiments, the first and the second field-insulating layers comprise a same material, and etching the first and the second field-insulating layers comprises simultaneously etching the first and the second field-insulating layers.

In various embodiments, further comprising annealing an upper surface of the second field-insulating layer and the stopper layer, after forming the second field-insulating layer.

In various embodiments, the second field-insulating layer comprises an oxide, the stopper layer comprises a nitride, and the annealing comprises an oxide surface treatment.

According to yet other aspects of the present inventive concepts, there is provided a method for fabricating a semiconductor device, including forming a first fin-type pattern on a substrate, comprising a first sidewall and a second sidewall opposed to each other; forming a first trench in contact with the first sidewall; forming a second trench in contact with the second sidewall; at least partially filling the first trench with a first field-insulating layer; forming a stopper layer on the first fin-type pattern and the first field insulating layer; forming a second trench in contact with the second sidewall; at least partially filling the second trench with a second field-insulating layer, the second field-insulating layer comprising a first region and a second region, an upper surface of the second region being higher than an upper surface of the first field-insulating layer; removing the stopper layer to expose a side surface of the second field-insulating layer which protrudes higher than the first field insulating layer; etching the first and the second field-insulating layers, so that an upper portion of the fin-type pattern protrudes higher than the first field insulating layer; and forming a gate electrode on the first fin-type pattern, the first field-insulating layer and the second field-insulating layer, the gate electrode intersecting the first fin-type pattern and overlapping the second region.

In various embodiments, a width of the second trench is greater than a width of the first trench.

In various embodiments, a bottom surface of the second trench is lower than a bottom surface of the first trench.

In various embodiments, the first and the second field-insulating layers comprise a same material, and etching the first and the second field-insulating layers comprises simultaneously etching the first and the second field-insulating layers.

In various embodiments, the method further includes annealing an upper surface of the second field-insulating layer and the stopper layer, after forming the second field-insulating layer.

In various embodiments, the second field-insulating layer comprises an oxide; the stopper layer comprises a nitride, and the annealing comprises an oxide surface treatment.

BRIEF DESCRIPTION OF THE DRAWINGS

Exemplary embodiments of one or more new and useful process, machine, manufacture, and/or improvement thereof, in accordance with the inventive concept, are provided in the following detailed description taken in conjunction with the accompanying drawings, in which.

DETAILED DESCRIPTION OF THE EMBODIMENTS

Figure 1:
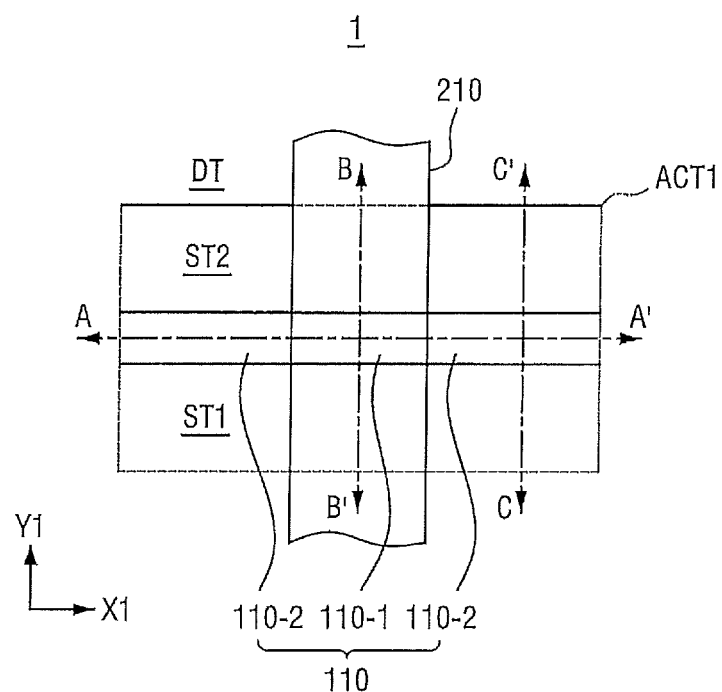
FIG. 1 is a layout view diagram illustrating a semiconductor device substrate according to a first exemplary embodiment of the present inventive concepts.

Aspects of the inventive concept will now be described more fully with reference to the accompanying drawings, in which exemplary embodiments are shown. The inventive concept may, however, be embodied in many different forms and should not be construed as limited to the exemplary embodiments set forth herein. Reference numerals are denoted in detail in the exemplary embodiments of the inventive concept and their examples are indicated in the accompanying drawings. The same reference numerals are used in the description and drawings in order to refer to the same or similar parts wherever possible.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the teen "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

To the extent that functional features, operations, and/or steps are described herein, or otherwise understood to be included within various embodiments of the inventive concept, such functional features, operations, and/or steps can be embodied in functional blocks, units, modules, operations and/or methods. And to the extent that such functional blocks, units, modules, operations and/or methods include computer program code, such computer program code can be stored in a computer readable medium, e.g., such as non-transitory memory and media, that is executable by at least one computer processor.

Hereinbelow, a semiconductor device according to a first exemplary embodiment of the present inventive concepts will be explained with reference to FIGS. 1 to 5.

Figure 2:
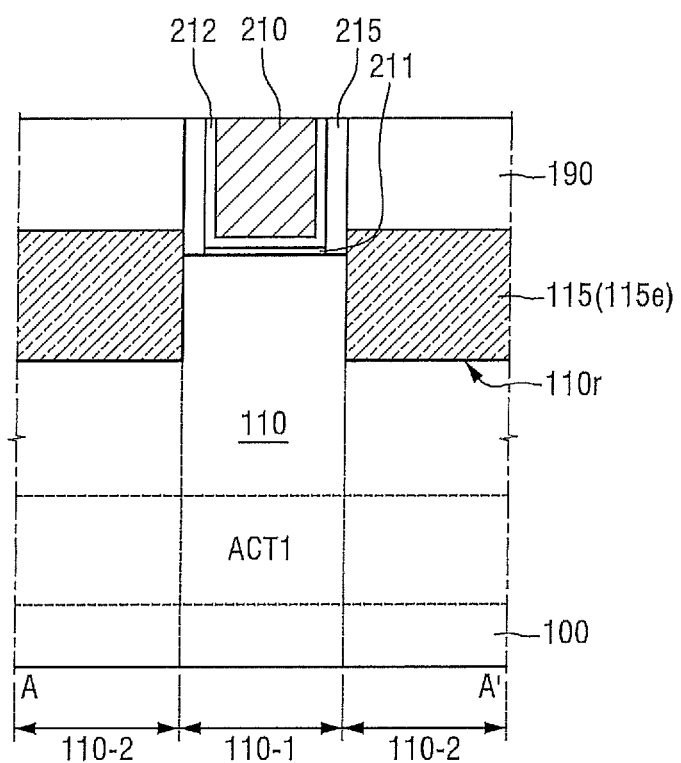
FIG. 2 is a cross-sectional view diagram taken along line A-A' of FIG. 1.
Figure 3:
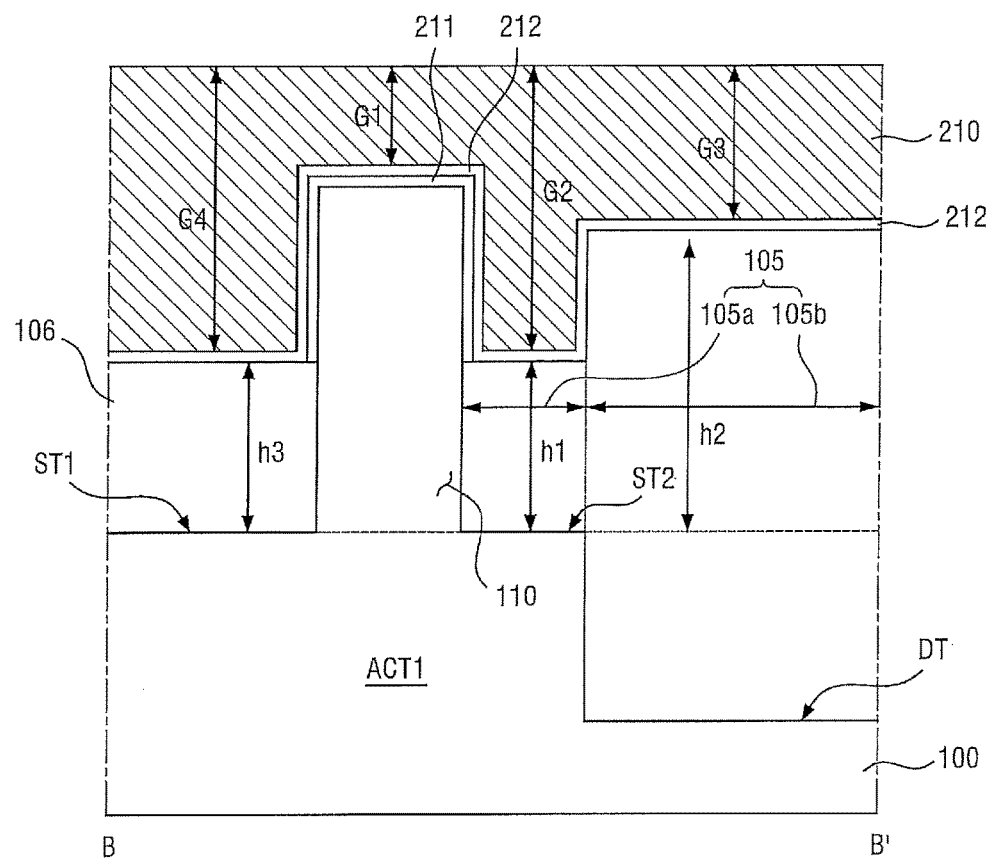
FIG. 3 is a cross-sectional view diagram taken along line B-B' of FIG. 1.
Figure 4:
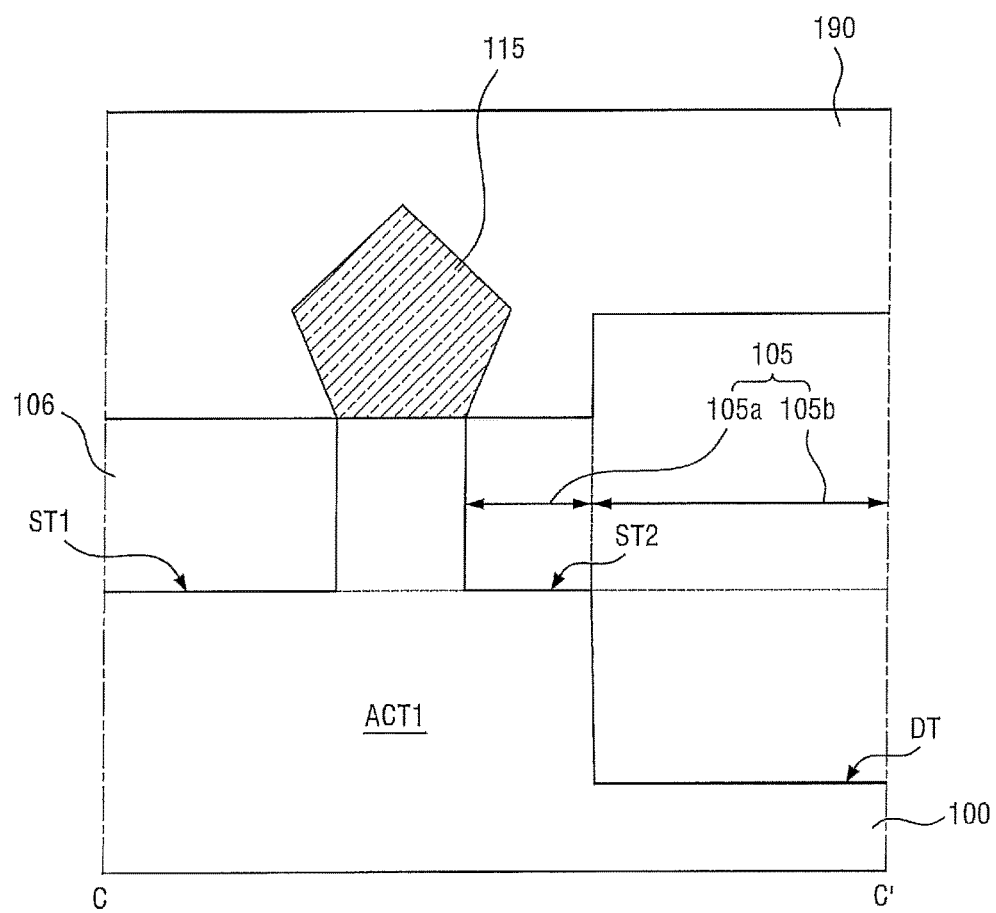
FIG. 4 is a cross-sectional view diagram taken along line C-C' of FIG. 1.
Figure 5:
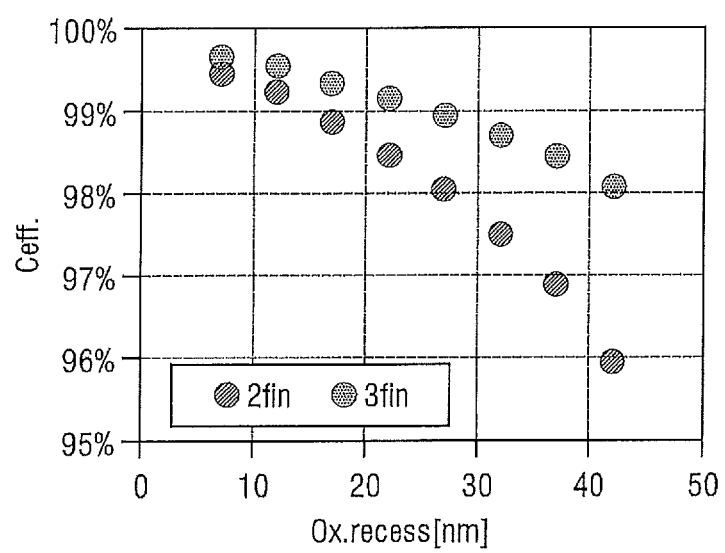
FIG. 5 is a graph illustrating capacitance of the semiconductor device according to the first exemplary embodiment of the present inventive concepts.

FIG. 1 is a layout view diagram illustrating a semiconductor device substrate according to the first exemplary embodiment of the present inventive concepts. FIG. 2 is a cross-sectional view diagram taken along line A-A' of FIG. 1. FIG. 3 is a cross-sectional view diagram taken along line B-B' of FIG. 1. FIG. 4 is a cross-sectional view diagram taken along line C-C' of FIG. 1. FIG. 5 is a graph illustrating capacitance of the semiconductor device according to the first exemplary embodiment of the present inventive concepts.

Referring to FIGS. 1 to 5, a semiconductor device 1 according to the first exemplary embodiment includes a first shallow trench ST1, a deep trench DT, a first field-insulating layer 106, a second field-insulating layer 105, a first fin-type pattern 110, and a first gate electrode 210.

The first fin-type pattern 110 is formed within a first active region ACT1 of a substrate 100. The first fin-type pattern 110 is elongated in a first direction X1.

The substrate 100 may be a silicon substrate, a bulk silicon or a silicon-on-insulator (SOI), for example. Alternatively, the substrate 100 may include an element semiconductor such as germanium, or a compound semiconductor such as a IV-IV group compound semiconductor or a III-V group compound semiconductor, for example. Alternatively, the substrate 100 may be a base substrate having an epitaxial layer formed thereon.

In the case of the IV-IV group compound semiconductor, the substrate may be a binary compound or a ternary compound including at least two or more of carbon (C), silicon (Si), germanium (Ge), and tin (Sn), or the binary or the ternary compound doped with a IV group element.

In the case of a III-V group compound semiconductor, the substrate may be one of a binary compound, ternary compound and quaternary compound which is formed by a combination of at least one of aluminum (Al), gallium (Ga), and indium (In) as a III group element, with one of phosphorus (P), arsenic (As) and antimony (Sb) as a V group element.

In the semiconductor device according to exemplary embodiments, it is assumed that the first fin-type pattern 110 is a silicon fin-type active pattern, which includes silicon.

As illustrated in FIG. 1, the first fin-type pattern 110 is in a rectangular shape, but exemplary embodiments are not limited thereto. The first fin-type pattern 110 in the rectangular shape includes a long side and a short side.

The first fin-type pattern 110 includes a first portion 110-1 and a second portion 110-2. The second portion 110-2 of the first fin-type pattern is disposed on both sides of the first portion 110-1 of the first fin-type pattern in a first direction X1.

The first fin-type pattern 110 includes a first side surface and a second side surface opposed to each other on both sides in a second direction Y1. The first shallow trench ST1 is in contact with the first side surface, and a second shallow trench ST2 is in contact with the second side surface. That is, the first fin-type pattern 110 is defined by the first shallow trench ST1 and the second shallow trench ST2.

The first shallow trench ST1 is formed in contact with the first side surface of the first fin-type pattern 110. That is, the bottom surface of the first shallow trench ST1 is the upper surface of the substrate 100, and one side surface of the first shallow trench ST1 is the first side surface of the first fin-type pattern 110. A first field-insulating layer 106 is formed within the first shallow trench ST1.

The second shallow trench ST2 is foamed in contact with the second side surface of the first fin-type pattern 110. That is, the bottom surface of the second shallow trench ST2 is the upper surface of the substrate 100, and one side surface of the second shallow trench ST2 is the second side surface of the first fin-type pattern 110.

The second shallow trench ST2 is in contact with the first fin-type pattern 110 and also in contact with the deep trench DT. That is, the second shallow trench ST2 is in contact with the deep trench DT at a side opposite to the side that it is in contact with the first fin-type pattern 110.

The deep trench DT is in contact with the second shallow trench ST2. The bottom surface of the deep trench DT may be connected with the bottom surface of the second shallow trench ST2. The bottom surface of the second shallow trench ST2 is at a different level within the semiconductor device than the bottom surface of the deep trench DT. Accordingly, a stepped region is formed between the bottom surface of the deep trench DT and the bottom surface of the second shallow trench ST2.

The bottom surface of the deep trench DT is also at a different level within the semiconductor device than the bottom surface of the first shallow trench ST1. Accordingly, the first shallow trench ST1 and the second shallow trench ST2 define the first fin-type pattern 110, and the deep trench DT defines the first active region ACT1. A second field-insulating layer 105 is formed within the second shallow trench ST2 and the deep trench DT.

The first field-insulating layer 106 is formed on the substrate 100 and disposed along the first fin-type pattern 110. Since the first field insulating layer 106 is formed so as to partially cover the first fin-type pattern 110, a portion of the first fin-type pattern 110 protrudes upward higher than the upper surface of the first field-insulating layer 106. That is, the first field-insulating layer 106 partially fills the first shallow trench ST1.

The first field-insulating layer 106 may be an oxide layer, a nitride layer, an oxynitride layer or a layer combining these. Alternatively, the first field-insulating layer 106 may include, for example, at least one of silicon oxide, silicon nitride, silicon oxynitride, and a low-k dielectric material with a smaller dielectric constant than silicon oxide. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited thereto.

The second field-insulating layer 105 is formed on the substrate 100 and disposed along the first fin-type pattern 110. Since the second field insulating layer 105 is formed so as to partially cover the first fin-type pattern 110, a portion of the first fin-type pattern 110 protrudes upward higher than the upper surface of the second field insulating layer 105. That is, the second field insulating layer 105 partially fills the second shallow trench ST2 and the deep trench DT.

The second field-insulating layer 105 includes a first region 105a and a second region 105b. The first region 105a is in contact with the first fin-type pattern 110. The first region 105a is positioned between the first fin-type pattern 110 and the second region 105b and partially fills the second shallow trench ST2.

The second region 105b is formed farther from the first fin-type pattern 110 than the first region 105a is. The second region 105b is in contact with the first region 105a and partially fills the deep trench DT.

For example, the first region 105a and the second region 105b of the second field insulating layer 105 may be an oxide layer, a nitride layer, an oxynitride layer or a layer combining these. Alternatively, the second field-insulating layer 105 may include, for example, at least one of silicon oxide, silicon nitride, silicon oxynitride, and a low-k dielectric material with a smaller dielectric constant than silicon oxide. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The second field-insulating layer 105 may also include a same material as the first field insulating layer 106.

The first region 105a of the second field-insulating layer 105 has a first height h1 and the second region 105b of the second field insulating layer 105 has a second height h2. The first height h1 and the second height 112 herein refer to distances from the bottom surface of the second shallow trench ST2 to the upper surfaces of the first region 105a and the second region 105b the second field-insulating layer 105, respectively. The second height h2 may be greater than the first height h1. That is, the upper surface of the second region 105b of the second field insulating layer 105 is higher than the upper surface of the first region 105a. The upper surface of the second field-insulating layer 105 may be lower than the upper surface of the first fin-type pattern 110.

The first field-insulating layer 106 has a third height h3. The third height h3 refers to a distance between the bottom surface of the first shallow trench ST1 and the upper surface of the first field-insulating layer 106. The third height h3 is lower than the second height h2, such that the upper surface of the second region 105b of the second field-insulating layer 105 is higher than the upper surface of the first field-insulating layer 106.

The lower surface of the second field-insulating layer 105 is in contact with the bottom surface of the second shallow trench ST2 and the bottom surface of the deep trench DT. That is, the lower surface of the first region 105a is in contact with the bottom surface of the second shallow trench ST2, and the lower surface of the second region 105b is in contact with the bottom surface of the deep trench DT. Accordingly, the lower surface of the first region 105a is higher than the lower surface of the second region 105b and the lower surface of the first field-insulating layer 106 is higher than the lower surface of the second region 105b.

The first gate electrode 210 is formed so as to extend in the second direction Y1, thus intersecting the first fin-type pattern 110. The first gate electrode 210 is disposed on the first fin-type pattern 110 and on the first and second field insulating layers 106, 105. The first gate electrode 210 is formed on the first portion 110-1 of the first fin-type pattern 110.

The first gate electrode 210 is formed so as to partially surround the side surfaces of the first fin-type pattern 110 and surround the upper surface of the first fin-type pattern 110. The bottom surface of the first gate electrode 210 is formed along the profile of the first fin-type pattern 110, the first field insulating layer 106 and the second field insulating layer 105.

The first gate electrode 210 has a first thickness G1 at a region overlapping the first fin-type pattern 110, a second thickness G2 at a region overlapping the first region 105a of the second field insulating layer 105, a third thickness G3 at a region overlapping the second region 105b and a fourth thickness G4 at a region overlapping the first field-insulating layer 106.

The upper surface of the first gate electrode 210 is formed to be coplanar by the chemical-mechanical planarization (CMP) process. Accordingly, the thickness of the first gate electrode 210 may be determined depending on the profile of the upper surface of the first gate electrode 210.

The first thickness G1 of the first gate electrode 210 is less than the second thickness G2, the third thickness G3 and the fourth thickness G4. This is attributable to the fact that the height of the upper surface of the first fin-type pattern 110 is greater than the height of the upper surfaces of the first field insulating layer 106 and the second field-insulating layer 105.

The third thickness G3 of the first gate electrode 210 is less than the second thickness G2 and the fourth thickness G4. This is attributable to the fact that the upper surface of the second region 105b of the second field-insulating layer 105 is higher than the upper surface of the first region 105a of the second field insulating layer 105 and higher than the upper surface of the field insulating layer 106.

Gate insulating layers 211, 212 are formed between the first fin-type pattern 110 and the first gate electrode 210. The gate insulating layers 211, 212 may include an interfacial layer 211 and a high-k dielectric insulating layer 212.

The interfacial layer 211 is formed by partially oxidizing the first fin-type pattern 110. The interfacial layer 211 is formed along the profile of the first fin-type pattern 110, protruding upward higher than the upper surfaces of the first and the second field-insulating layers 106, 105. When the first fin-type pattern 110 is a silicon fin-type pattern including silicon, the interfacial layer 211 may include a silicon oxide layer.

As illustrated in FIG. 3, the interfacial layer 211 is not formed along the upper surfaces of the first and the second field-insulating layers 106, 105, but exemplary embodiments are not limited thereto. Depending on methods of forming the interfacial layer 211, the interfacial layer 211 may be formed along the upper surfaces of the first and the second field-insulating layers 106, 105.

Further, even in an example where the first and the second field-insulating layers 106, 105 include silicon oxide, the interfacial layer 211 may be formed along the upper surfaces of the first and the second field-insulating layers 106, 105, if the silicon oxide included in the first and the second field-insulating layers 106, 105 has different physical properties from the silicon oxide layer included in the interfacial layer 211.

The high-k dielectric insulating layer 212 is foinied between the interfacial layer 211 and the first gate electrode 210. It may be formed along the profile of the first fin-type pattern 110 protruding upward higher than the upper surfaces of the first and the second field-insulating layers 106, 105. Further, the high-k dielectric insulating layer 212 is formed between the first gate electrode 210, and the first field-insulating layer 106 and the second field-insulating layer 105.

For example, the high-k dielectric insulating layer 212 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

A gate spacer 215 is disposed on a sidewall of the first gate electrode 210 extending in the second direction Y1. The gate spacer 215 may include, for example, at least one of silicon nitride (SiN), silicon oxynitride (SiON), silicon oxide (SiO$_2$), silicon oxycarbonitride (SiOCN), and a combination thereof.

The source/drain 115 is formed on both sides of the first gate electrode 210, and on the first fin-type pattern 110. For example, the source/drain 115 is formed on the second portion 110-2 of the first fin-type pattern.

The source/drain 115 includes an epitaxial layer 115e formed by epitaxy and is configured as an elevated source/drain. The epitaxial layer 115e fills a recess 110r formed in the second portion 110-2 of the first fin-type pattern 110.

An outer circumference of the epitaxial layer 115e may have a variety of shapes. For example, the shape of the outer circumference of the epitaxial layer 115e may be at least one of diamond, circle, rectangle or any other shape. FIG. 4 illustrates a pentagon shape, for example.

When the semiconductor device 1 according to an exemplary embodiment is a PMOS transistor, the epitaxial layer 115e may include a compressive stress material. For example, the compressive stress material may be SiGe which has a higher lattice constant compared to Si. The compressive stress material can enhance mobility of the carrier in the channel region by exerting compressive stress on the first fin-type pattern 110.

Meanwhile, when the semiconductor device 1 according to an exemplary embodiment is a NMOS transistor, the epitaxial layer 115e may include a tensile stress material. For example, when the first fin-type pattern 110 is silicon, the epitaxial layer 115e may be a material such as SiC which has a smaller lattice constant than the silicon. The tensile stress material can enhance mobility of the carrier in the channel region by exerting tensile stress on the first fin-type pattern 110.

An interlayer insulating layer 190 covers the first fin-type pattern 110 and the source/drain 115. The interlayer-insulating layer 190 is formed on the first and the second field insulating layers 106, 105.

The interlayer-insulating layer 190 may include at least one of silicon oxide, silicon nitride, silicon oxynitride, and a low-k dielectric material with a smaller dielectric constant than silicon oxide. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited thereto.

Referring to FIG. 5, the effective capacitance of the first gate electrode 210 of the semiconductor device 1 according to the first exemplary embodiment is explained below.

In FIG. 5, the horizontal axis represents a difference (h2−h1) between the height h2 of the upper surface of the second region 105b of the second field-insulating layer 105 and the height h1 of the upper surface of the first region 105b of the second field-insulating layer 105.

The vertical axis in FIG. 5 represents the percentage of the effective capacitance when the effective capacitance is normalized to 100% in an example where the upper surface of the first field-insulating layer 105 is at a same height as the upper surface of the second field-insulating layer 106.

FIG. 5 illustrates a result of simulating a case in which there are two fin-type patterns on each of both sides of the second field-insulating layer 105 and a case in which there are three fin-type patterns on each of both sides of the second field-insulating layer 105. According to the simulation result, the effective capacitance of the first gate electrode 210 decreases, as the height difference (h2−h1) between the upper surface of the second region 105b of the second field insulating layer 105 and the height h1 of the upper surface of the first region 105b of the second field insulating layer 105 increases. It is also confirmed that the effective capacitance decreases less when there are three fin-type patterns on each of both sides of the second field-insulating layer 105, compared to when there are two fin-type patterns on each of both sides of the second field-insulating layer 105.

That is, as the volume of the first gate electrode 210 decreases, the effective capacitance thereof decreases, thus further enhancing AC performance and reliability of the semiconductor device 1.

Hereinbelow, a semiconductor device 2 according to a second exemplary embodiment of the present inventive concepts is explained with reference to FIGS. 1, 6 and 7. In the following description, elements in common with the semiconductor device 1 already described above will not be described or described as brief as possible, while the rest will be elaborated.

Figure 6:
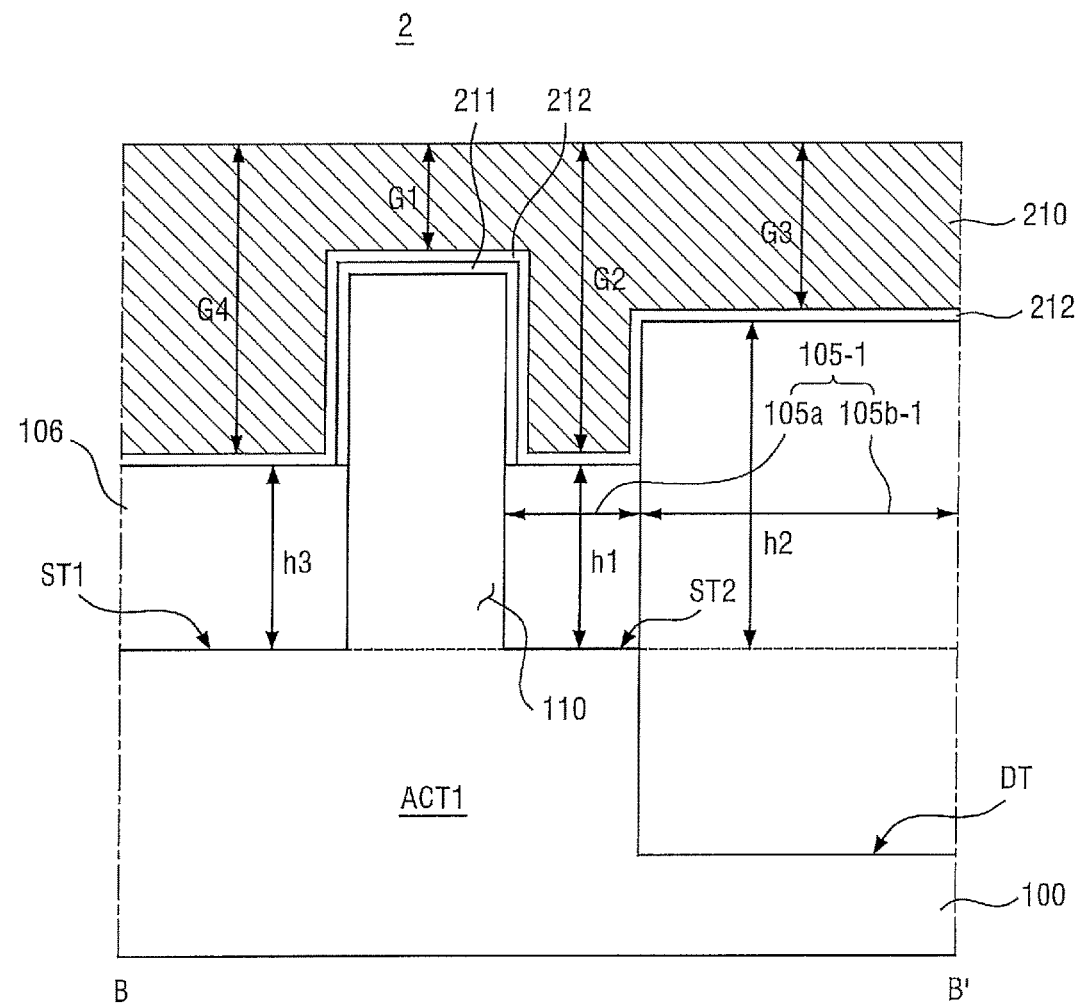
FIGS. 6 and 7 are cross sectional view diagrams illustrating a semiconductor device according to a second exemplary embodiment of the present inventive concepts.
Figure 7:
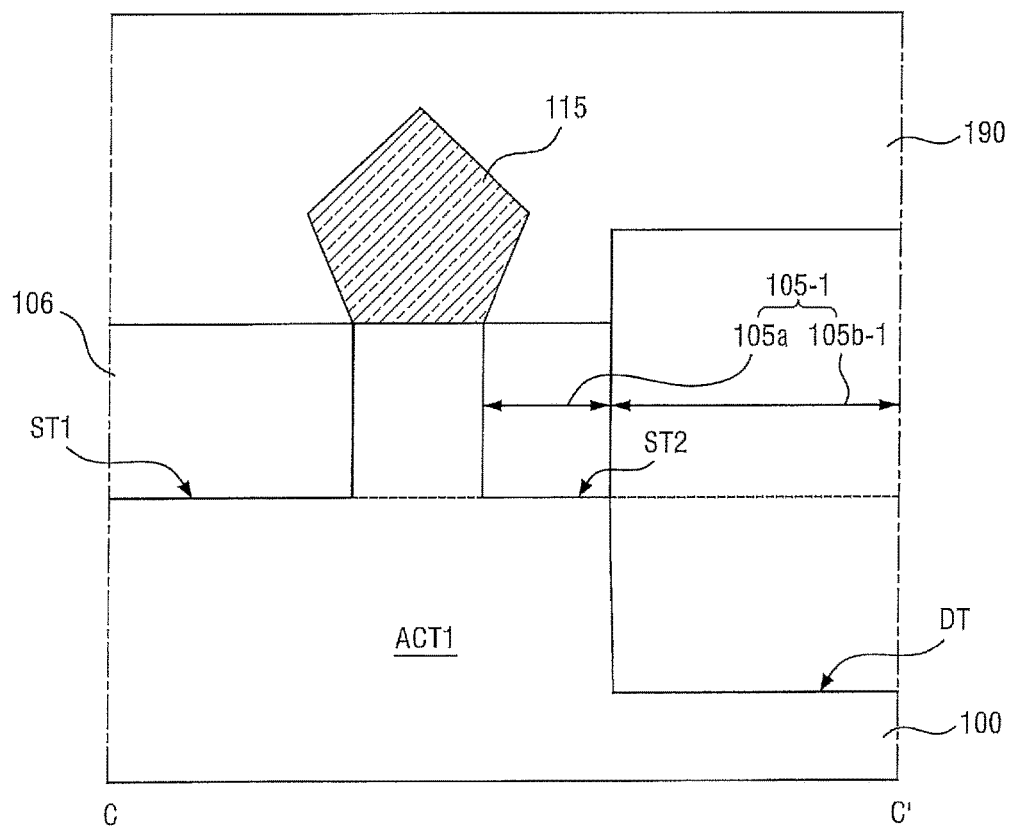

FIGS. 6 and 7 are cross sectional view diagrams illustrating a semiconductor device according to the second exemplary embodiment of the present inventive concepts. Specifically, FIG. 6 is a cross sectional view taken along line B-B' of FIG. 1, and FIG. 7 is a cross sectional view taken along line C-C' of FIG. 1.

Referring to FIGS. 6 and 7, the second field-insulating layer 105-1 of the semiconductor device 2 according to the second exemplary embodiment includes a first region 105a and a second region 105b-1, which may include different materials from each other.

The materials for the first field-insulating layer 106 and the first region 105a and the second region 105b-1 of the second field insulating layer 105-1 may be selected in consideration of insulating properties and gap filling capabilities. For example, the first field-insulating layer 106 may include a same material as the first region 105a of the second field-insulating layer 105-1, and the first field insulating layer 106 may include a material different from the second region 105b-1 of the second field insulating layer 105-1. However, exemplary embodiments are not limited to the example given above.

For example, the first region 105a and the second region 105b-1 may include at least one of silicon oxide, silicon nitride, silicon oxynitride, and a low-k dielectric material with a smaller dielectric constant than silicon oxide. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

If the first region 105a includes TOSZ, the second region 105b-1 may include USG instead of TOSZ. However, the above examples are provided only for illustrative purpose, and exemplary embodiments are not limited thereto.

Hereinbelow, a semiconductor device 3 according to a third exemplary embodiment exemplary embodiment of the present inventive concepts is explained with reference to FIGS. 1 and 8. In the following description, those elements in common with the semiconductor devices 1, 2 already described above will not be described or described as brief as possible, while the rest will be elaborated.

Figure 8:
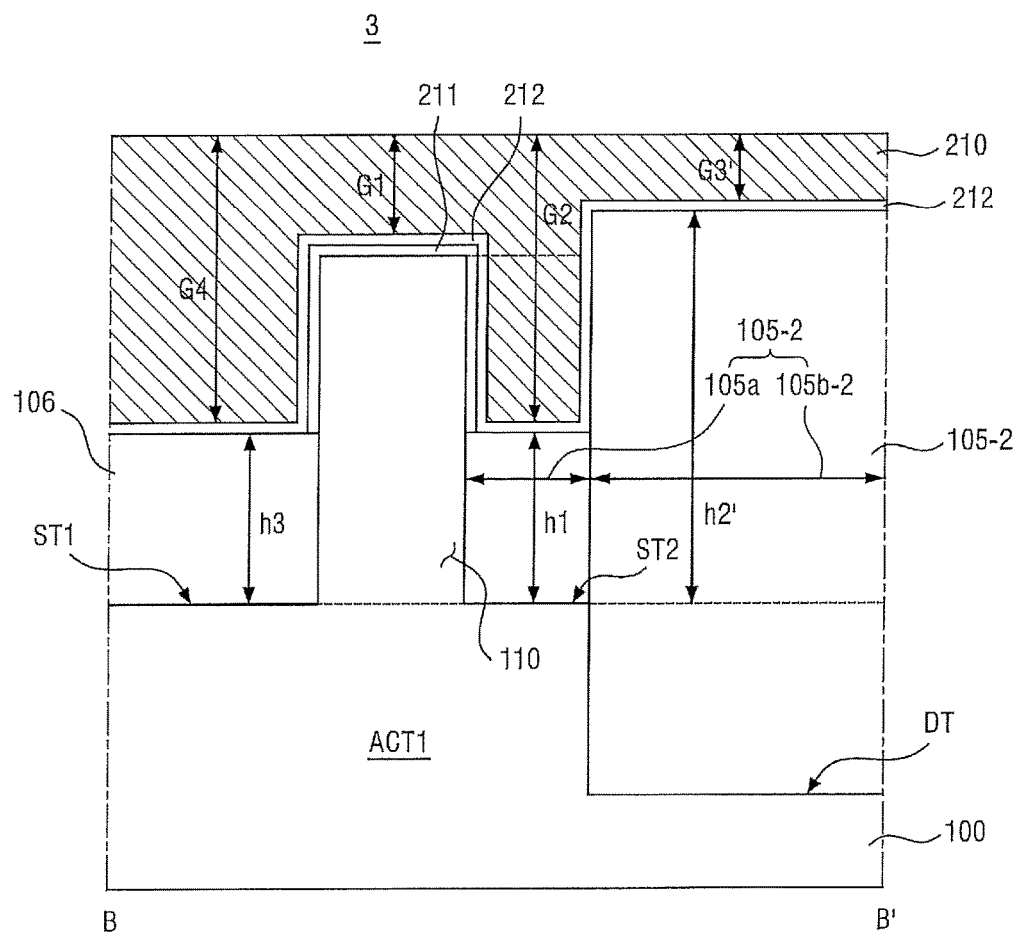
FIG. 8 is a cross-sectional view diagram illustrating a semiconductor device according to a third exemplary embodiment of the present inventive concepts.

FIG. 8 is a cross sectional view diagram illustrating a semiconductor device according to the third exemplary embodiment of the present inventive concepts.

Referring to FIG. 8, the upper surface of the second region 105b-2 of the second field-insulating layer 105-2 of the semiconductor device 3 according to the third exemplary embodiment is at a higher height than the upper surface of the first fin-type pattern 110. Accordingly, the second height h2' of the second region 105b-2 of the second field insulating layer 105-2 is greater than a distance between the upper surface of the first fin-type pattern 110 and the bottom surface of the second shallow trench ST2.

The third thickness G3' of the first gate electrode 210 is less than the first thickness G1. This is attributable to the fact that the height h2' of the second region 105b-2 of the second field insulating layer 105-2 is increased. As the third thickness G3' of the first gate electrode 210 decreases, the effective capacitance of the first gate electrode 210 decreases, and accordingly, the reliability of the semiconductor device 3 can be enhanced.

Hereinbelow, a semiconductor device 4 according to a fourth exemplary embodiment of the present inventive concepts is explained with reference to FIGS. 1 and 9. In the following description, those elements in common with the semiconductor devices 1, 2, 3 already described above will not be described or described as brief as possible, while the rest will be elaborated.

Figure 9:
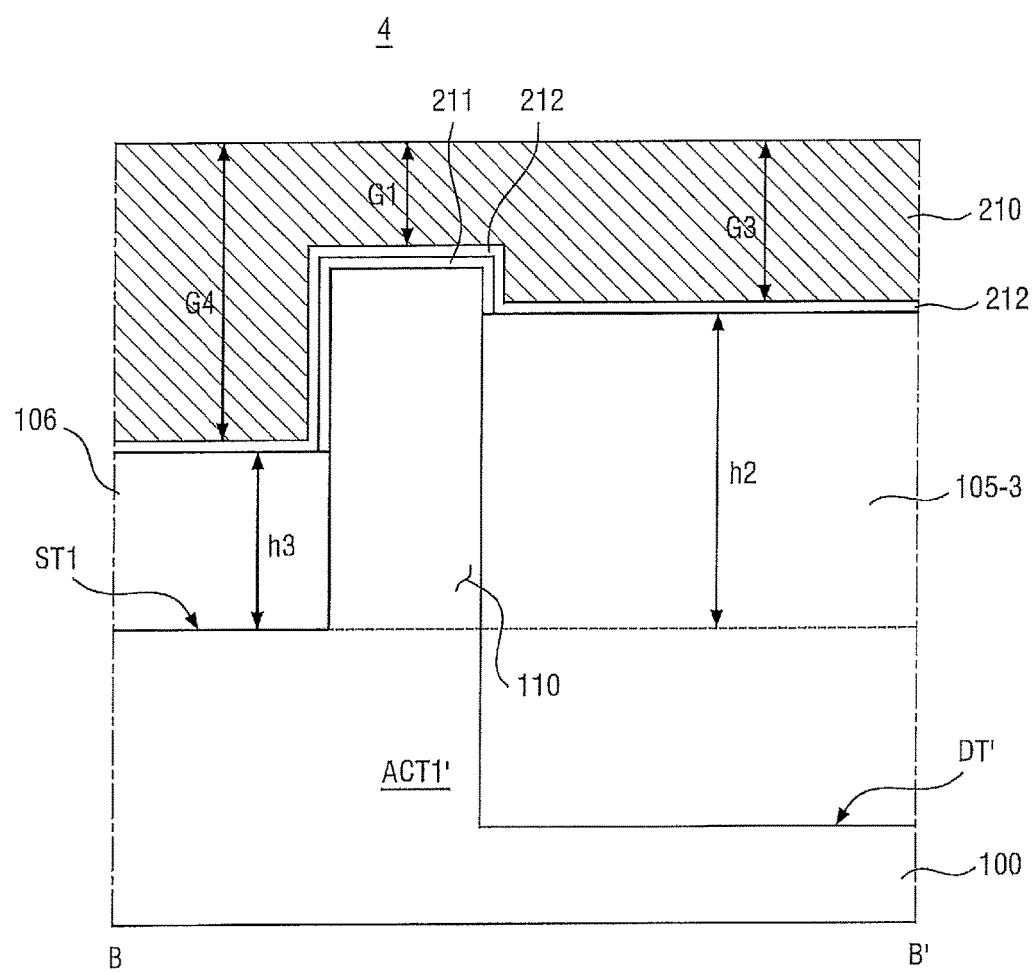
FIG. 9 is a cross-sectional view diagram illustrating a semiconductor device according to a fourth exemplary embodiment of the present inventive concepts.

FIG. 9 is a cross sectional view diagram illustrating a semiconductor device according to the fourth exemplary embodiment of the present inventive concepts.

Referring to FIG. 9, unlike the semiconductor devices 1, 2, 3, the semiconductor device 4 according to the fourth exemplary embodiment does not include the second shallow trench ST2 (FIG. 3), and the deep trench DT is directly contacted with the second side surface of the first fin-type pattern 110. Accordingly, the second field insulating layer 105-3 partially fills the deep trench DT'. Accordingly, the first active region ACT1' of the semiconductor device 4 has a different shape than that of the first active region ACT1 of the semiconductor devices 1-3.

The semiconductor device 4 according to the fourth exemplary embodiment omits the decreased height area on the upper surface of the second field-insulating layer 105-3 contacting the second side surface of the first fin-type pattern 110, which thus facilitates subsequent processes. Additionally, further decreased thickness of the first gate electrode 210 proximate the first fin-type pattern 110 allows reduced capacitance by the first gate electrode 210. Accordingly, the semiconductor device 4 has enhanced reliability and performance.

Hereinbelow, a semiconductor device 5 according to a fifth exemplary embodiment of the present inventive concepts is explained with reference to FIGS. 1, 10 and 11. In the following description, those elements in common with the semiconductor devices 1, 2, 3, 4 already described above will not be described or described as brief as possible, while the rest will be elaborated.

Figure 10:
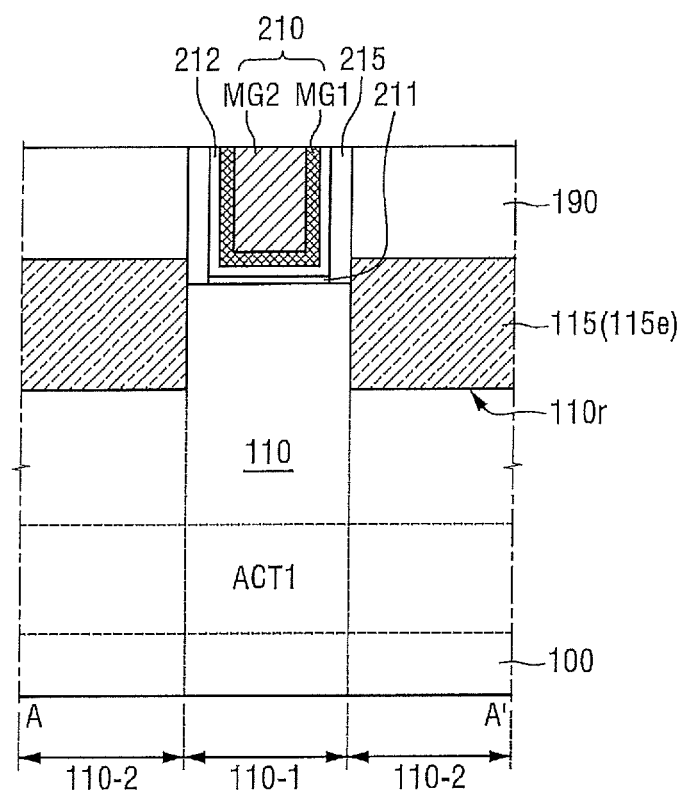
FIGS. 10 and 11 are cross-sectional view diagrams illustrating cross-sectional view diagram a semiconductor device according to a fifth exemplary embodiment of the present inventive concepts.
Figure 11:
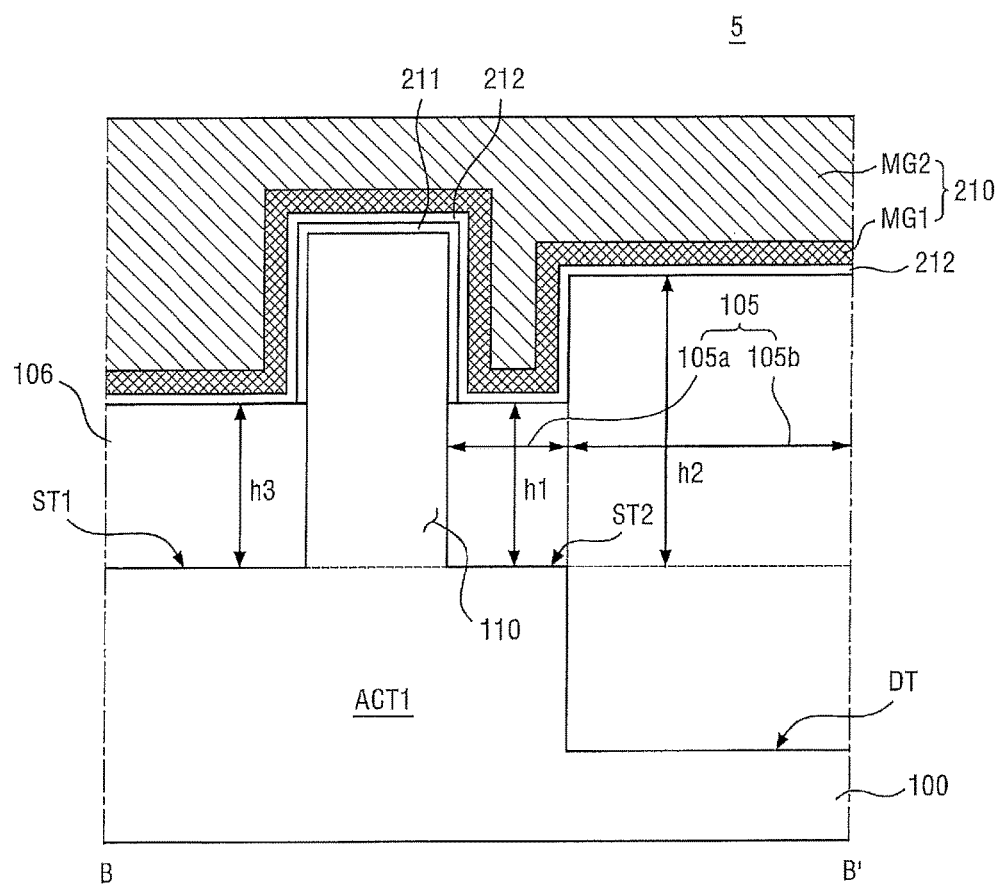

FIGS. 10 and 11 are cross sectional view diagrams illustrating a semiconductor device according to the fifth exemplary embodiment of the present inventive concepts. Specifically, FIG. 10 is a cross sectional view taken along line A-A' of FIG. 1, and FIG. 11 is a cross sectional view taken along line B-B' of FIG. 1.

Referring to FIGS. 10 and 11, the first gate electrode 210 of the semiconductor device 5 according to the fifth exemplary embodiment includes metal layers MG1, MG2. As illustrated, the first gate electrode 210 includes a stack of two or more metal layers MG1, MG2. The first metal layer MG1 plays a role of adjusting a work function, and the second metal layer MG2 plays a role of filling a space defined by the first metal layer MG1. For example, the first metal layer MG1 may include at least one of, for example, TiN, WN, TiAl, TiAlN, TaN, TiC, TaC, TaCN, TaSiN and a combination thereof, but not limited thereto. Further, the second metal layer MG2 may include at least one of, for example, W, Al, Cu, Co, Ti, Ta, poly-Si, SiGe and a metal alloy, but not limited thereto.

For example, the first gate electrode 210 described above may be formed by replacement process (or gate last process), but not limited thereto.

Hereinbelow, a semiconductor device 6 according to a sixth exemplary embodiment of the present inventive concepts is explained with reference to FIGS. 1, 2 and 12 to 15. In the following description, those elements in common with the semiconductor devices 1, 2, 3, 4, 5 already described above will not be described or described as brief as possible, while the rest will be elaborated.

Figure 12:
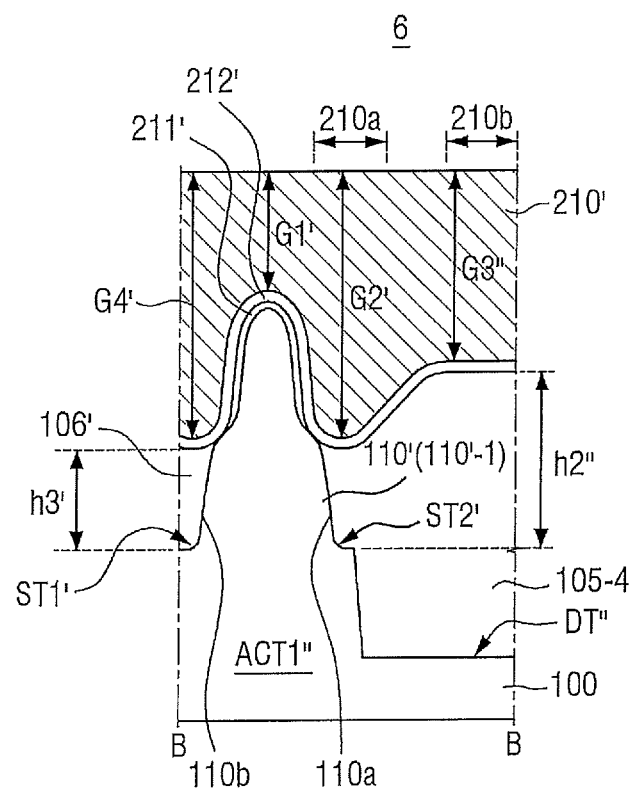
FIGS. 12 to 15 are cross-sectional view diagrams illustrating cross-sectional view diagram a semiconductor device according to a sixth exemplary embodiment of the present inventive concepts.
Figure 13:
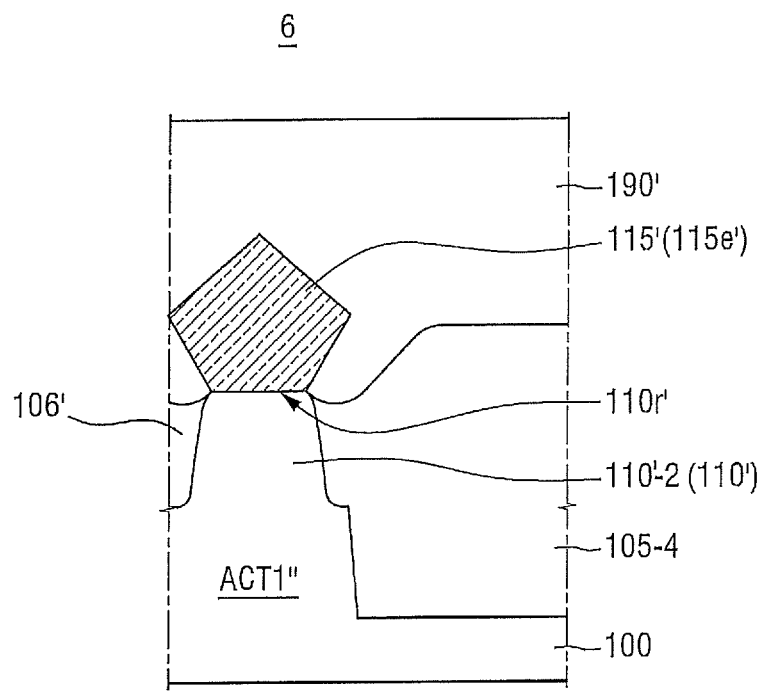
Figure 14:
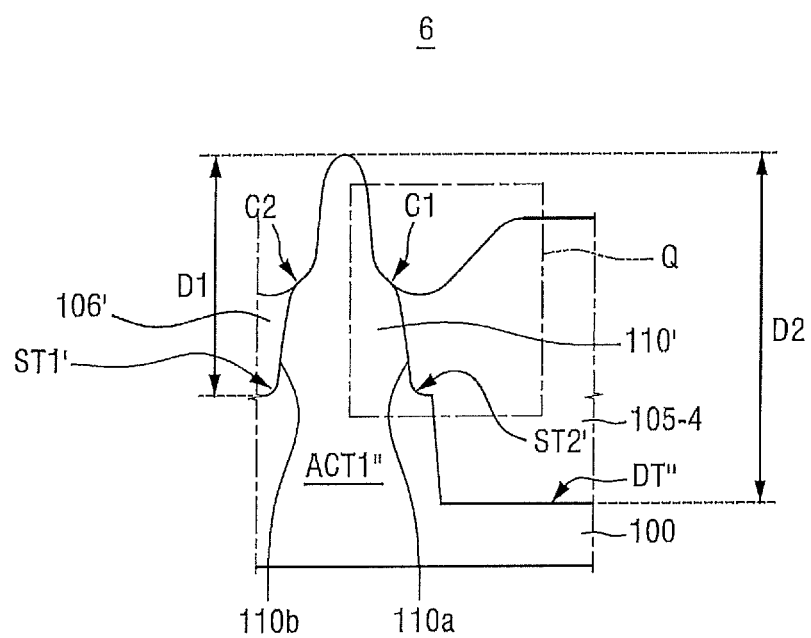
Figure 15:
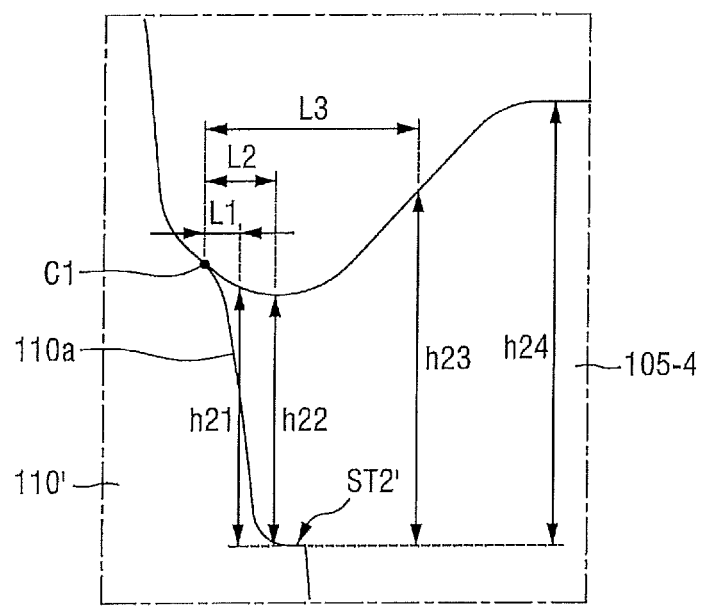

FIGS. 12 to 15 are cross sectional view diagrams illustrating a semiconductor device according to the sixth exemplary embodiment of the present inventive concepts. Specifically, FIG. 12 is a cross sectional view taken along line B-B' of FIG. 1, and FIG. 13 is a cross sectional view taken along line C-C' of FIG. 1. FIG. 14 is a diagram of the semiconductor device of FIG. 12 from which the first gate electrode is omitted. FIG. 15 shows an enlargement view of a squared area Q in FIG. 14.

Referring to FIGS. 1, 2 and 12 to 15, a semiconductor device 6 according to the sixth exemplary embodiment includes a curved surface, which is distinct from the semiconductor devices 1-5 having the respective constituent elements as described above.

The first fin-type pattern 110' includes a first side surface and a second side surface opposed to each other on either side in a second direction Y1. The first shallow trench ST1' is in contact with the first side surface, and a second shallow trench ST2' is in contact with the second side surface. That is, the first fin-type pattern 110' is defined by the first shallow trench ST1' and the second shallow trench ST2'.

The first shallow trench ST1' is foamed in contact with the first side surface of the first fin-type pattern 110'. That is, the bottom surface of the first shallow trench ST1' is the upper surface of the substrate 100, and one side surface of the first shallow trench ST1' is the first side surface of the first fin-type pattern 110'. A first field insulating layer 106' is formed within the first shallow trench ST1'.

The second shallow trench ST2' is formed in contact with the second side surface of the first fin-type pattern 110'. That is, the bottom surface of the second shallow trench ST2' is the upper surface of the substrate 100, and one side surface of the second shallow trench ST2' is the second side surface of the first fin-type pattern 110'.

The second shallow trench ST2' is in contact with the first fin-type pattern 110' and also in contact with the deep trench DT''. The bottom surface of the deep trench DT'' is connected with the bottom surface of the second shallow trench ST2' by a side surface of the deep trench DT''. The bottom surface of the second shallow trench ST2' is higher than the bottom surface of the deep trench DT''. Accordingly, a stepped region may be formed between the bottom surface of the deep trench DT'' and the bottom surface of the second shallow trench ST2'.

The bottom surface of the deep trench DT'' is lower than the bottom surface of the first shallow trench ST1'. Accordingly, the first shallow trench ST1' and the second shallow trench ST2' define the first fin-type pattern 110', and the deep trench DT'' defines the first active region ACT1''. A second field insulating layer 105-4 is formed within the second shallow trench ST2' and the deep trench DT''.

The first field-insulating layer 106' is formed in the shallow trench ST1'' on the substrate 100 and disposed along the first fin-type pattern 110'. Since the first field-insulating layer 106' is formed so as to partially cover the first fin-type pattern 110', a portion of the first fin-type pattern 110' protrudes upward higher than the upper surface of the first field-insulating layer 106'. That is, the first field-insulating layer 106' partially fills the first shallow trench ST1'.

For example, the first field-insulating layer 106' may be an oxide layer, a nitride layer, an oxynitride layer or a layer combining these. Alternatively, the first field insulating layer 106' may include, for example, at least one of silicon oxide, silicon nitride, silicon oxynitride, and a low-k dielectric material with a smaller dielectric constant than silicon oxide. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited thereto.

The second field-insulating layer 105-4 may be formed on the substrate 100 and disposed along the first fin-type pattern 110'. Since the second field-insulating layer 105-4 is formed so as to partially cover the first fin-type pattern 110', a portion of the first fin-type pattern 110' protrudes upward higher than the upper surface of the second field-insulating layer 105-4. That is, the second field-insulating layer 105-4 partially fills the second shallow trench ST2' and the deep trench DT''.

The first gate electrode 210' is formed so as to extend in the second direction Y1, thus intersecting the first fin-type pattern 110'. The first gate electrode 210' is formed on the first portion 110'-1 of the first fin-type pattern 110' and on the second field-insulating layer 105-4. As the first gate electrode 210' is formed on the first field-insulating layer 106' and the second field-insulating layer 105-4, the bottom surface of the first gate electrode 210' is formed along the profile of the upper surfaces of the first field-insulating layer 106', the first fin-type pattern 110' and the second field-insulating layer 105-4.

Gate insulating layers 211', 212' are formed between the first fin-type pattern 110' and the first gate electrode 210'. The gate insulating layers 211', 212' include an interfacial layer 211' and a high-k dielectric insulating layer 212'.

The interfacial layer 211' is formed by partially oxidizing the first fin-type pattern 110'. The interfacial layer 211' is formed along the profile of the first fin-type pattern 110' protruding upward higher than the upper surfaces of the first and the second field-insulating layers 106', 105-4. When the first fin-type pattern 110' is a silicon fin-type pattern including silicon, the interfacial layer 211' includes a silicon oxide layer.

As illustrated in FIG. 12, the interfacial layer 211' is not formed along the upper surfaces of the first and the second field-insulating layers 106', 105-4, but exemplary embodiments are not limited thereto. Depending on methods of forming the interfacial layer 211', the interfacial layer 211' may be formed along the upper surfaces of the first and the second field insulating layers 106', 105-4.

Further, even in an example where the first and the second field-insulating layers 106', 105-4 include silicon oxide, the interfacial layer 211' may be formed along the upper surfaces of the first and the second field insulating layers 106', 105-4, if the silicon oxide included in the first and the second field insulating layers 106', 105-4 has different properties from the silicon oxide layer included in the interfacial layer 211'.

The high-k dielectric insulating layer 212' is formed between the interfacial layer 211' and the first gate electrode 210'. It is formed along the profile of the first fin-type pattern 110' protruding upward higher than the upper surfaces of the first and the second field-insulating layers 106', 105-4. Further, the high-k dielectric insulating layer 212' is formed between the first gate electrode 210' and the first field insulating layer 106' and the second field-insulating layer 105-4.

A source/drain 115' is formed on both sides of the first gate electrode 210', and on the first fin-type pattern 110'. For example, the source/drain 115' is formed on the second portion 110'-2 of the first fin-type pattern.

The source/drain 115' includes an epitaxial layer 115e' formed by epitaxy and is an elevated source/drain. The epitaxial layer 115e fills a recess 110r' formed in the second portion 110'-2 of the first fin-type pattern 110'.

An outer circumference of the epitaxial layer 115'e may have a variety of shapes. For example, the shape of the outer circumference of the epitaxial layer 115'e may be at least one of diamond, circle and rectangle or any other shape. FIG. 13 illustrates a pentagon shape, for example.

An interlayer insulating layer 190 covers the first fin-type pattern 110 and the source/drain 115. The interlayer insulating layer 190' is formed on the field insulating layer 105-4.

For example, the interlayer insulating layer 190' may include at least one of silicon oxide, silicon nitride, silicon oxynitride, and a low-k dielectric material with a smaller dielectric constant than silicon oxide.

Meanwhile, referring to FIGS. 1, 14 and 15, the first fin-type pattern 110' is defined by the first shallow trench ST1' and the second shallow trench ST2' of the first depth D1, and the first active region ACT1'' is defined by the deep trench DT'' of the second depth D2 which is deeper than the second shallow trench ST2'.

In the semiconductor device 6 according to the sixth exemplary embodiment, the first shallow trench ST1' and the second shallow trench ST2' are disposed on either side of the first fin-type pattern 110'.

The first shallow trench ST1' and the second shallow trench ST2' are disposed directly adjacent to each other. As used herein, the term "directly adjacent" refers to absence of other shallow trench of a first depth between the second shallow trench ST2' and the first shallow trench ST1'. The second shallow trench ST2' is adjacent to the deep trench DT'', and the second shallow trench ST2' and the bottom surface of the deep trench DT'' are connected with each other by a side surface of the deep trench DT''.

The first field-insulating layer 106' is formed so as to partially fill the first shallow trench ST1'. The second field-insulating layer 105-4 partially fills the second shallow trench ST2' and the deep trench DT''. The first fin-type pattern 110' includes a first sidewall 110b and a second sidewall 110a facing each other.

As illustrated in FIG. 14, when there is one fin-type pattern formed in the first active region ACT1'', the first sidewall 110b of the first fin-type pattern and the second sidewall 110a of the first fin-type pattern are connected with the bottom surfaces of the first shallow trench ST1' and the second shallow trench ST2', respectively. The second sidewall 110a is connected with the deep trench DT'' through the bottom of the second shallow trench ST2'.

The first field-insulating layer 106' contacts a portion of the first fin-type pattern 110'. Specifically, the first field-insulating layer 106' contacts a portion of the first sidewall 110b of the first fin-type pattern. The second field insulating layer 105-4 also contacts a portion of the first fin-type pattern 110'. Specifically, the second field-insulating layer 105-4 contacts a portion of the second sidewall 110a of the first fin-type pattern.

The first sidewall 110b of the first fin-type pattern and the upper surface of the first field insulating layer 106' contact at a first contact C2, and the second sidewall 110a of the first fin-type pattern and the upper surface of the second field insulating layer 105-4 contact at a second contact C1. The first sidewall 110b of the first fin-type pattern includes the first contact C2, and the second sidewall 110a of the first fin-type pattern includes the second contact C1.

The portion of the first fin-type pattern 110' lower than the first contact C2 and the second contact C1 is in contact with the first and the second field-insulating layers 106', 105-4, while the portion of the first fin-type pattern 110' higher than the first contact C2 and the second contact C1 is not in contact with the first and the second field-insulating layers 106', 105-4.

In the semiconductor device according to the sixth exemplary embodiment, the upper surface of the second field-insulating layer 105-4 includes a portion that is higher than the contact C1 between the second sidewall 110a of the first fin-type pattern 110' and the upper surface of the second field-insulating layer 105-4.

More specifically, the upper surface of the second field-insulating layer 105-4 includes a portion that is lower than the contact C1 between the second sidewall 110a of the first fin-type pattern and the upper surface of the second field-insulating layer 105-4, and a portion that is higher than the contact C1.

As illustrated in FIG. 14, the portion of the upper surface of the second field insulating layer 105-4 that is lower than the contact C1 between the second sidewall 110a of the first fin-type pattern and the upper surface of the second field-insulating layer 105-4 is positioned between the first fin-type pattern 110' and the portion of the upper surface of the second field-insulating layer 105-4 that is higher than the contact C1 between the second sidewall 110a of the first fin-type pattern and the upper surface of the second field-insulating layer 105-4.

The portion of the upper surface of the first field-insulating layer 106' that is lower than the contact C2 between the first sidewall 110b of the first fin-type pattern and the upper surface of the first field-insulating layer 106' is positioned over the first shallow trench ST1'. The portion of the upper surface of the second field-insulating layer 105-4 that is higher than the contact C1 between the second sidewall 110a of the first fin-type pattern and the upper surface of the second field-insulating layer 105-4 is positioned over the deep trench DT''. The portion of the upper surface of the second field insulating layer 105-4 that is lower than the contact C1 between the second sidewall 110a of the first fin-type pattern and the upper surface of the second field-insulating layer 105-4 is positioned over the second shallow trench ST2'.

At a portion 210b of the first gate electrode 210' and the first fin-type pattern 110' the upper surface of the second field-insulating layer 105-4 approaches closer to the upper surface of the substrate 100 before increasing in distance away therefrom.

More specifically, at a location spaced from the second contact C1 on the second sidewall 110a of the first fin-type pattern by a first distance L1, the height from the bottom of the second shallow trench ST2' to the upper surface of the second field-insulating layer 105-4 is a fourth height H21, and at a location spaced away from the second contact C1 on the second sidewall 110a of the first fin-type pattern by a second distance L2, the height from the bottom of the second shallow trench ST2' to the upper surface of the second field-insulating layer 105-4 is a fifth height h22.

Herein, the fourth height h21 and the fifth height h22 are less than the height from the bottom of the second shallow trench ST2' to the second contact C1 on the second sidewall 110a of the first fin-type pattern. Further, the fourth height h21 is greater than the fifth height h22.

Further, at a location spaced away from the second contact C1 on the second sidewall 110a of the first fin-type pattern by a third distance L3, the height from the bottom of the second shallow trench ST2' to the upper surface of the second field insulating layer 105-4 is a sixth height h23. The height from the bottom of the second shallow trench ST2' to an uppermost portion of the upper surface of the second field-insulating layer 105-4 is a seventh height h24.

Herein, the sixth height h23 and the seventh height h24 are greater than the height from the bottom of the second shallow trench ST2' to the second contact C1 on the second sidewall 110a of the first fin-type pattern. That is, the sixth height h23 and the seventh height h24 are greater than the fourth height h21 and the fifth height h22.

Further, the height h24 from the bottom of the second shallow trench ST2 to the uppermost portion of the upper surface of the second field-insulating layer 105-4 is less than the height of the first fin-type pattern 110' that is defined by the second shallow trench ST2' of the first depth D1. In other words, the height of the first fin-type pattern 110' is greater than the height h24, relative to a common base height, such as the bottom surface of the second shallow trench ST2'.

At a portion 210b of the first gate electrode 210' and the upper surface of the second field insulating layer 105-4, the height h24 from the bottom of the second shallow trench ST2' to the uppermost portion of the upper surface of the second field-insulating layer 105-4 is less than the height D1 from the bottom of the second shallow trench ST2' to the uppermost portion of the first fin-type pattern 110'.

Referring to FIGS. 1, 12 and 13, at the second field-insulating layer 105-4 overlapping the first gate electrode 210', the upper surface of the second field-insulating layer 105-4 includes a portion higher than, and a portion lower than a contact between the upper surface of the second field-insulating layer 105-4 and the first portion 110'-1 of the first fin-type pattern.

Additionally, at the second field-insulating layer 105-4 that does not overlap the first gate electrode 210', the upper surface of the second field-insulating layer 105-4 includes a portion higher than, and a portion lower than a contact between the upper surface of the second field-insulating layer 105-4 and the second portion 110-2 of the first fin-type pattern.

In the semiconductor device according to the first exemplary embodiment, the upper surface of the field-insulating layer 105 overlapping the first gate electrode 210, and the upper surface of the field-insulating layer 105 non-overlapping the first gate electrode 210 each include a portion higher than, and a portion lower than a contact between the upper surface of the field-insulating layer 105 and the first fin-type pattern 110.

Additionally, referring to FIGS. 12 and 14, the bottom surface of the first gate electrode 210' is formed along the upper surface of the first and the second field-insulating layers 106', 105-4. Since the upper surface of the second field-insulating layer 105-4 includes a portion higher than, and a portion lower than a contact between the upper surface of the second field-insulating layer 105-4 and the first fin-type pattern 110', the bottom surface of the first gate electrode 210' is also formed along the profile of the upper surface of the second field-insulating layer 105-4.

As referred to above, the first gate electrode 210' includes a first portion 210a and a second portion 210b disposed in a sequential order starting from the second sidewall 110a of the first fin-type pattern.

The first portion 210a of the first gate electrode is faulted on the portion that is lower than the contact between the upper surface of the second field-insulating layer 105-4 and the first fin-type pattern 110', and the second portion 210b of the first gate electrode is formed on the portion that is higher than the contact between the upper surface of the second field-insulating layer 105-4 and the first fin-type pattern 110'.

Hereinbelow, a semiconductor device 7 according to a seventh exemplary embodiment of the present inventive concepts is explained with reference to FIGS. 16 and 17. In the following description, those elements in common with the semiconductor devices 1-6 already described above will not be described or described as brief as possible, while the rest will be elaborated.

Figure 16:
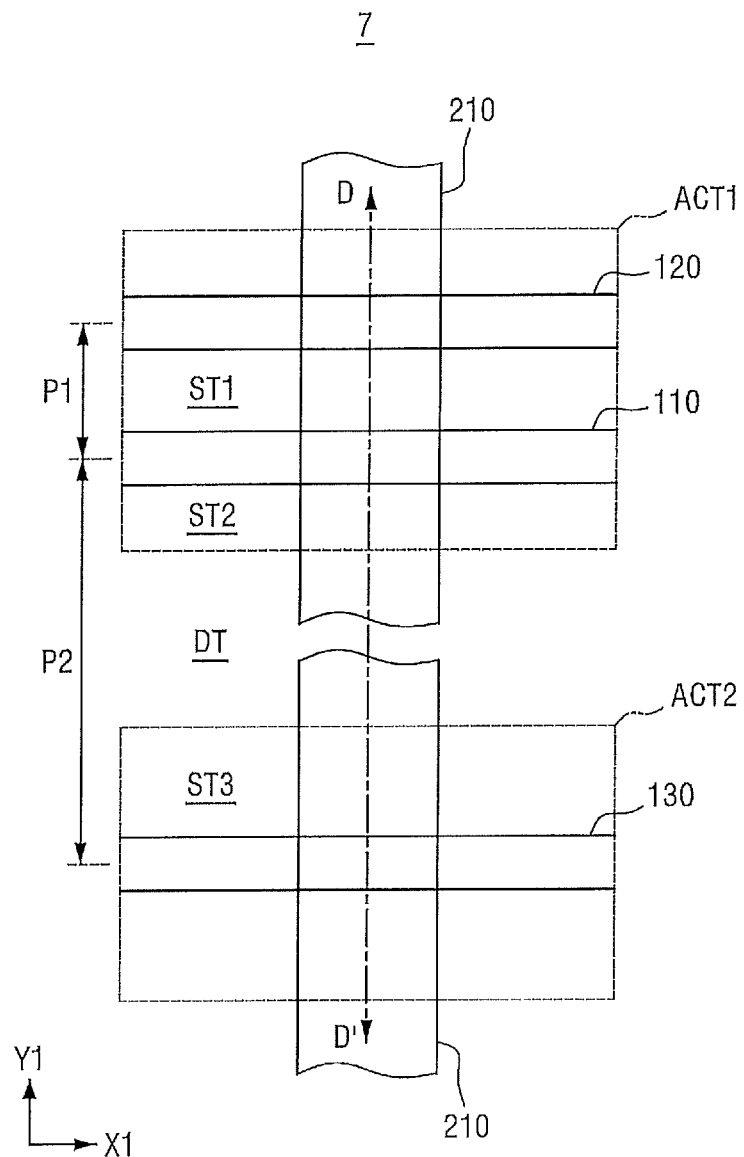
FIG. 16 is a layout view diagram illustrating a semiconductor device substrate according to a seventh exemplary embodiment of the present inventive concepts.

FIG. 16 is a layout diagram illustrating a semiconductor device according to the seventh exemplary embodiment. FIG. 17 is a cross sectional view taken along line D-D' of FIG. 16.

Figure 17:
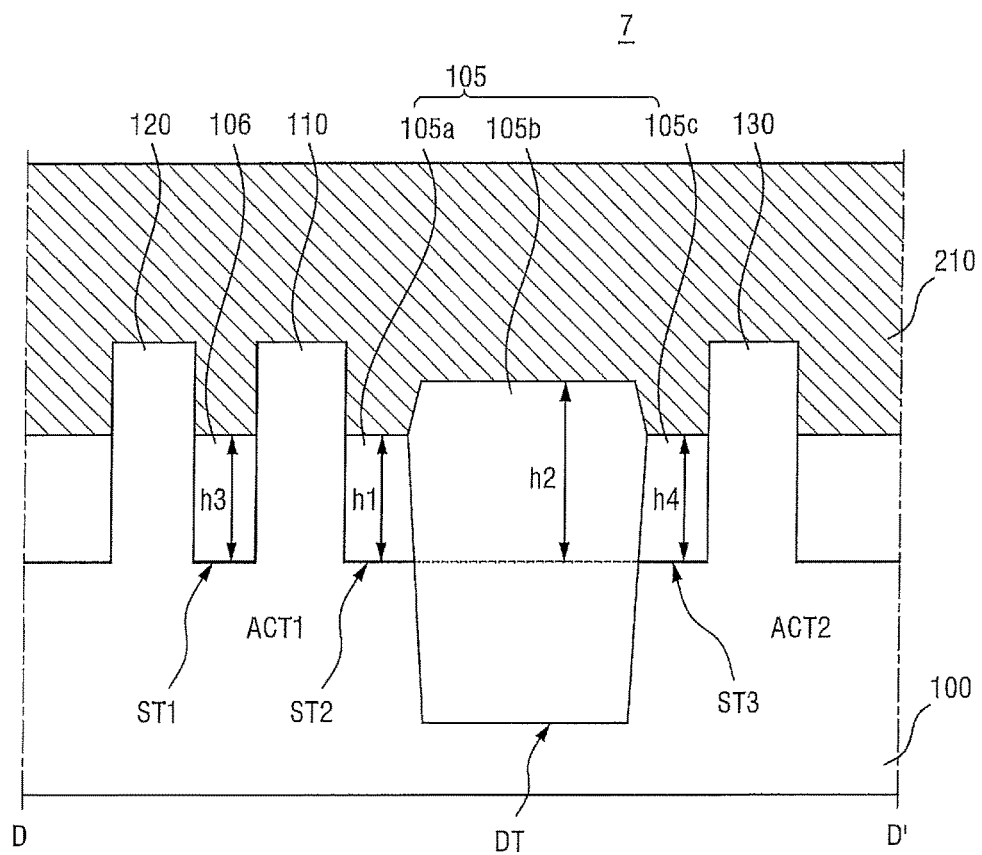
FIG. 17 is a cross sectional view diagram taken along line D-D' of FIG. 16.

Referring to FIGS. 16 and 17, the first active region ACT1 and the second active region ACT2 are isolated from each other, by the deep trench DT of the second depth h2.

The first fin-type pattern 110 and the second fin-type pattern 120 are formed within the first active region ACT1. The first fin-type pattern 110 and the second fin-type pattern 120 are defined by the first shallow trench ST1 of the third depth h3 and the second shallow trench ST2 of the first depth h1 which is smaller than the second depth h2 of the trench DT.

As illustrated in FIG. 16, two fin-type patterns may be formed within the first active region ACT1, but exemplary embodiments are not limited thereto. Accordingly, an additional fin-type pattern may be formed between the first fin-type pattern 110 and the second fin-type pattern 120, within the first active region ACT1.

It is only for convenience of explanation that an example of having two fin-type patterns 110, 120 in the first active region ACT1 is described herein.

In the semiconductor device according to the seventh exemplary embodiment, the first fin-type pattern 110 and the second fin-type pattern 120 are positioned directly adjacent to each other.

When the fin-type patterns are positioned directly adjacent to each other, this means that there is no fin-type pattern as defined by the shallow trench ST1 disposed between the first fin-type pattern 110 and the second fin-type pattern 120.

The first fin-type pattern 110 and the second fin-type pattern 120, which are isolated from each other by the first shallow trench ST1, are spaced from each other by a first distance P1.

Further, in the semiconductor device according to the seventh exemplary embodiment, the first fin-type pattern 110 may be the fin-type pattern that is located on the outermost edge of the first active region ACT1.

Being 'located on the outermost edge' herein refers to a situation in which no fin-type pattern defined by the shallow trench ST2 is disposed between the deep trench DT defining the first active region ACT1 and the first fin-type pattern 110. In other words, the first fin-type pattern 110 is directly adjacent to the deep trench DT of the second depth h2.

A third fin-type pattern 130 is formed within the second active region ACT2. The third fin-type pattern 130 is defined by a third shallow trench ST3 of a fourth depth h4 which is smaller than the second depth h2 of the trench DT.

As illustrated in FIG. 16, only one fin-type pattern 130 is formed within the second active region ACT2 (i.e., single fin structure). However, as an alternative to the illustrated example, two or more fin-type patterns may be formed within the second active region ACT2 (i.e., dual fin structure or multi fin structure).

The third shallow trench ST3 defining the third fin-type pattern 130 and the deep trench DT defining the second active region ACT2 are directly adjacent to each other. That is, in the semiconductor device according to the seventh exemplary embodiment, the third fin-type pattern 130 is the fin-type pattern that is located on the outermost edge of the second active region ACT2.

In the semiconductor device according to the seventh exemplary embodiment, the first fin-type pattern 110 and the second fin-type pattern 120 are directly adjacent to each other. Only the deep trench DT is located between the first fin-type pattern 110 and the third fin-type pattern 130, and there is no other fin-type pattern interposed between the first fin-type pattern 110 and the third fin-type pattern 130.

The first fin-type pattern 110 and the third fin-type pattern 130, which are directly adjacent to each other, are spaced from each other by a second distance P2. One side of the first fin-type pattern 110 is directly adjacent to the second fin-type pattern 120, while the other side thereof is directly adjacent to the third fin-type pattern 130.

The distance P1 between the first fin-type pattern 110 and the second fin-type pattern 120 may be different from the distance P2 between the first fin-type pattern 110 and the third fin-type pattern 130. In the semiconductor device according to the seventh exemplary embodiment, the distance P1 between the first fin-type pattern 110 and the second fin-type pattern 120 is less than the distance P2 between the first fin-type pattern 110 and the third fin-type pattern 130.

The first field-insulating layer 106 is formed so as to partially fill the first shallow trench ST1. The second field-insulating layer 105 partially fills the second shallow trench ST2, the deep trench DT, and the third shallow trench ST3.

The first gate electrode 210 is formed so as to intersect the first fin-type pattern 110, the second fin-type pattern 120 and the third fin-type pattern 130.

The second field-insulating layer 105 additionally includes a third region 105c. The third region 105c of the second field-insulating layer 105 is located between the second region 105b and the third fin-type pattern 130. The third region 105c is in contact with the second region 105b and is in contact with the third fin-type pattern 130, in a direction opposite to the direction of contacting the second region 105b.

The upper surface of the third region 105c is spaced from the bottom surface of the third shallow trench ST3 by an fourth height h4. The fourth height h4 may be smaller than the second height h2. Accordingly, the upper surface of the third region 105c is lower than the upper surface of the second region 105b.

Hereinbelow, a semiconductor device 8 according to an eighth exemplary embodiment of the present inventive concepts is explained with reference to FIGS. 16 and 18. In the following description, those elements in common with the semiconductor devices 1-7 already described above will not be described or described as brief as possible, while the rest will be elaborated.

Figure 18:
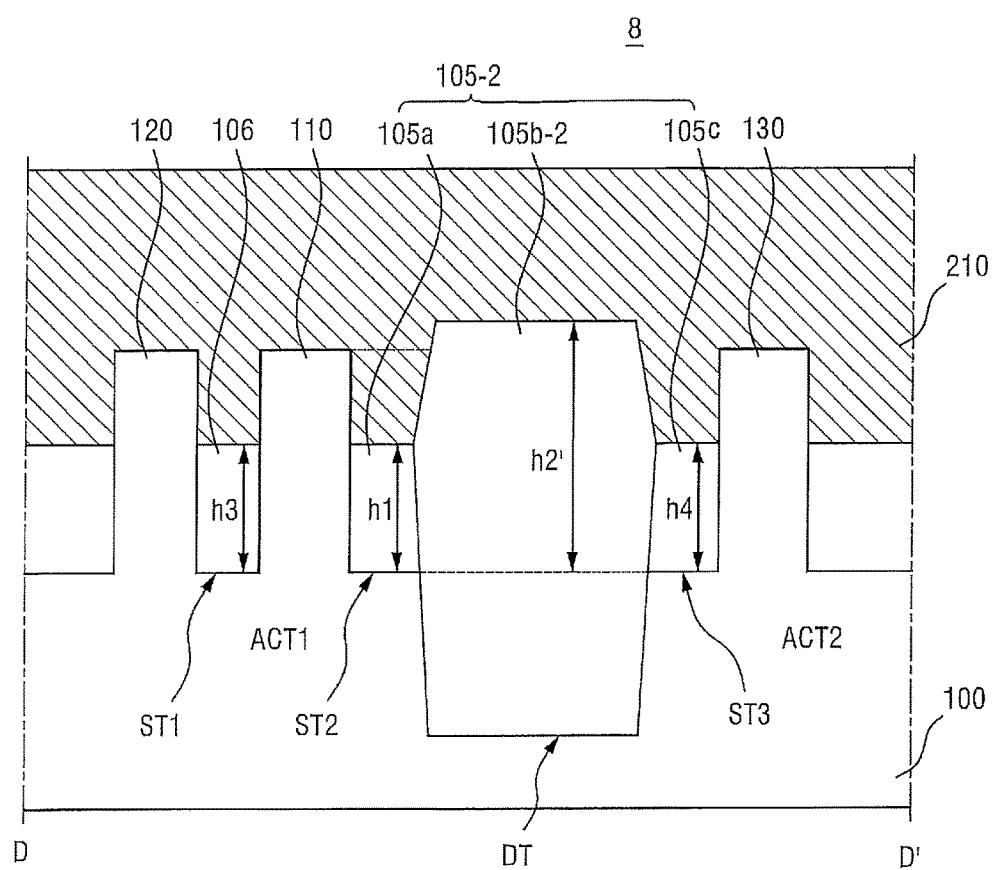
FIG. 18 is a cross-sectional view diagram illustrating a semiconductor device according to an eighth exemplary embodiment of the present inventive concepts.

FIG. 18 is a cross sectional view illustrating a semiconductor device according to the ninth exemplary embodiment.

Referring to FIGS. 16 and 18, the upper surface of the second region 105b-2 of the second field insulating layer 105-2 of the semiconductor device 3 according to the eighth exemplary embodiment is at a higher height than the upper surface of the first fin-type pattern 110. Accordingly, the second height h2' of the second region 105b-2 of the second field insulating layer 105-2 is greater than a distance between the upper surface of the first fin-type pattern 110 and the bottom surface of the second shallow trench ST2.

As the thickness of the first gate electrode 210 overlapping the second region 105b-2 decreases, the effective capacitance of the first gate electrode 210 decreases, and accordingly, the reliability of the semiconductor device 8 is enhanced.

Hereinbelow, a semiconductor device 9 according to a ninth exemplary embodiment of the present inventive concepts is explained with reference to FIGS. 16 and 19. In the following description, those elements in common with the semiconductor devices 1-8 already described above will not be described or described as brief as possible, while the rest will be elaborated.

Figure 19:
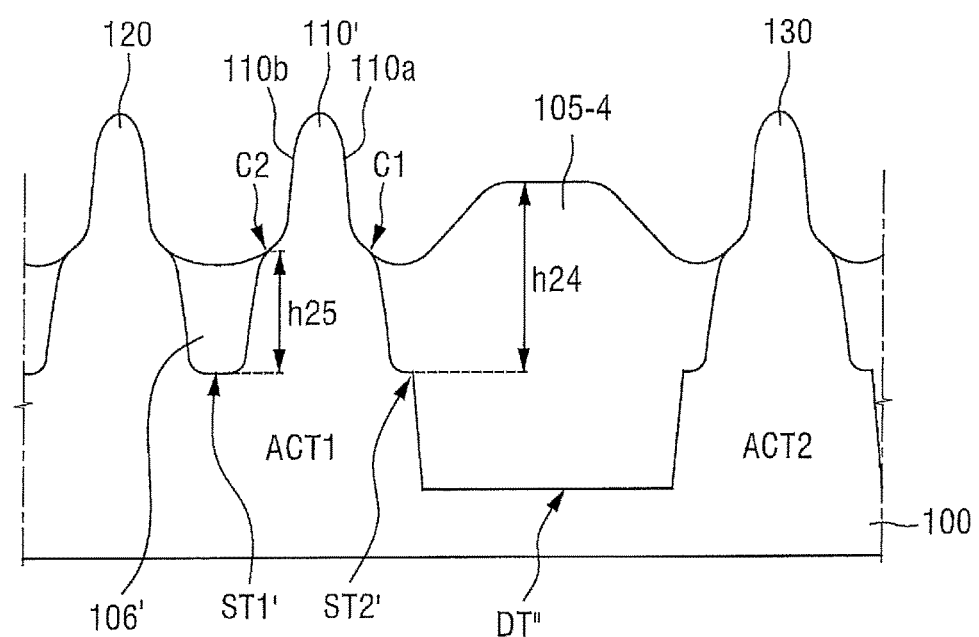
FIG. 19 is a cross sectional view provided to explain a semiconductor device according to a ninth exemplary embodiment of the present inventive concepts.

FIG. 19 is a cross sectional view illustrating a semiconductor device according to the ninth exemplary embodiment.

Referring to FIGS. 16 and 19, the first fin-type pattern 110' and the second fin-type pattern 120 are directly adjacent to each other, with the first field-insulating layer 106' being interposed therebetween in contact with the first sidewall 110b of the first fin-type pattern. The first fin-type pattern 110 and the third fin-type pattern 130 are directly adjacent to each other, with the second field-insulating layer 105-4 interposed therebetween in contact with the second sidewall 110a of the first fin-type pattern.

In the semiconductor device according to the ninth exemplary embodiment, the upper surface of the second field-insulating layer 105-4 includes a portion that is higher than the contact C1 between the second sidewall 110a of the first fin-type pattern and the upper surface of the second field-insulating layer 105-4. The upper surface of the first field insulating layer 106' is lower than the contact C2 between the first sidewall 110b of the first fin-type pattern and the upper surface of the first field-insulating layer 106'.

The upper surface of the second field insulating layer 105-4 includes a portion that is lower than, and a portion that is higher than the contact C1 between the second sidewall 110a of the first fin-type pattern and the upper surface of the second field-insulating layer 105-4. However, the upper surface of the first field insulating layer 106' does not include a portion that is higher than the contact C2 between the first fin-type pattern 110' and the upper surface of the first field-insulating layer 106'.

In the ninth exemplary embodiment, the height from the bottom of the second shallow trench ST2' to an uppermost portion of the upper surface of the second field-insulating layer 105-4 is a seventh height h24.

Further, the height from the bottom of the first shallow trench ST1' to the contact C2 between the upper surface of the first field-insulating layer 106' and the first fin-type pattern 110' is a ninth height h25.

In the semiconductor device according to the ninth exemplary embodiment, the height h24 from the bottom of the second shallow trench ST2' to the uppermost portion of the upper surface of the second field-insulating layer 105-4 is greater than the height h25 from the bottom of the first shallow trench ST1' to the uppermost portion of the upper surface of the first field-insulating layer 106'.

Further, the upper surface of the second field-insulating layer 105-4 between the first fin-type pattern 110' and the third fin-type pattern 130 includes a portion lower than, and a portion higher than the height from the bottom of the second shallow trench ST2' to the contact C1 between the upper surface of the second field-insulating layer 105-4 and the first fin-type pattern 110'.

Meanwhile, the upper surface of the first field-insulating layer 106' between the first fin-type pattern 110' and the second fin-type pattern 120 is lower than the height h25 from the bottom of the first shallow trench ST1' to the contact C2 between the upper surface oft he first field-insulating layer 106' and the first fin-type pattern 110'.

Referring to FIG. 19, in the example where there is the deep trench DT'' disposed between the first fin-type pattern 110' and the third fin-type pattern 130, the upper surface of the second field-insulating layer 105-4 that is higher than the contact C1 between the first fin-type pattern 110' and the second field-insulating layer 105-4 overlaps the deep trench DT''.

Referring to the first field-insulating layer 106' overlapping the first shallow trench ST1' between the first fin-type pattern 110' and the second fin-type pattern 120, the upper surface of the first field-insulating layer 106' is lower than the contact C2 between the first fin-type pattern 110' and the upper surface of the first field-insulating layer 106'.

In yet another aspect, the upper surface of the second field insulating layer 105-4 includes a portion concave toward the bottom of the second shallow trench ST2'. The upper surface of the second field insulating layer 105-4 which is concave toward the bottom of the second shallow trench ST2' overlaps the deep trench DT''. The first field-insulating layer 106' has a shape that is convex toward the bottom of the first shallow trench ST1'.

Figure 20:
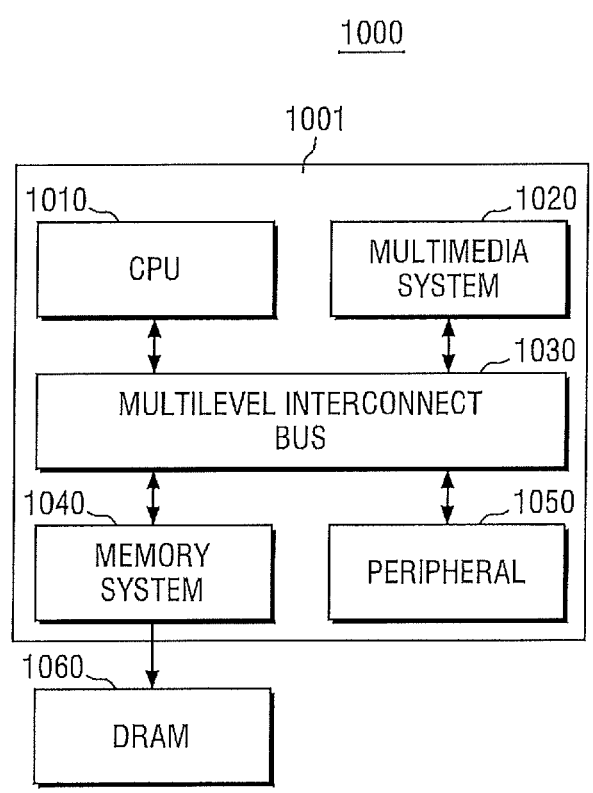
FIG. 20 is a schematic block diagram of an SoC system comprising a semiconductor device according to aspects of the present inventive concepts.

FIG. 20 is a schematic block diagram of an SoC system comprising a semiconductor device according to exemplary embodiments of the present inventive concepts.

Referring to FIG. 20, an SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for the driving of the SoC system 1000. In some exemplary embodiments, the CPU 1010 may be configured on a multi-core environment, which includes a plurality of cores.

The multimedia system 1020 may be used for performing a variety of multimedia functions on the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some exemplary embodiments, the bus 1030 may have a multi-layer structure. Specifically, an example of the bus 1030 may be a multi-layer advanced high-performance bus (AHB), or a multi-layer advanced eXtensible interface (AXI), although exemplary embodiments are not limited herein.

The memory system 1040 may provide environments necessary for the application processor 1001 to connect to an external memory (e.g., DRAM 1060) and perform high-speed operation. In some exemplary embodiments, the memory system 1040 may include a separate controller (e.g., DRAM controller) to control an external memory (e.g., DRAM 1060).

The peripheral circuit 1050 may provide environments necessary for the SoC system 1000 to have a smooth connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the exemplary embodiments explained above.

Figure 21:
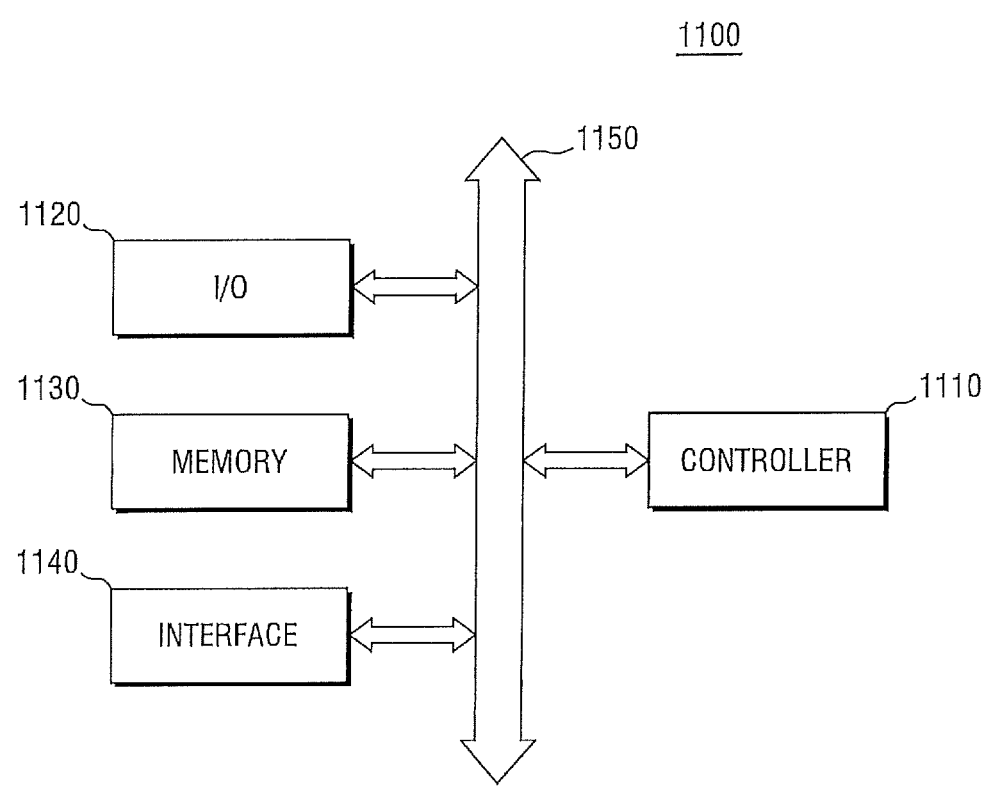
FIG. 21 is a schematic block diagram of an electronic system comprising a semiconductor device according to aspects of the present inventive concepts.

FIG. 21 is a schematic block diagram of an electronic system comprising a semiconductor device according to exemplary embodiments of the present inventive concepts.

Referring to FIG. 21, the electronic system 1100 according to an exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal processor, micro controller and logic devices capable of performing functions similar to those mentioned above. The I/O device 1120 may include a keypad, a keyboard or a display device. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed dynamic random access memory (DRAM) and/or a static random access memory (SRAM).

According to the exemplary embodiments described above, the semiconductor device may be provided within the memory device 1130, or provided as a part of the controller 1110 or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 22:
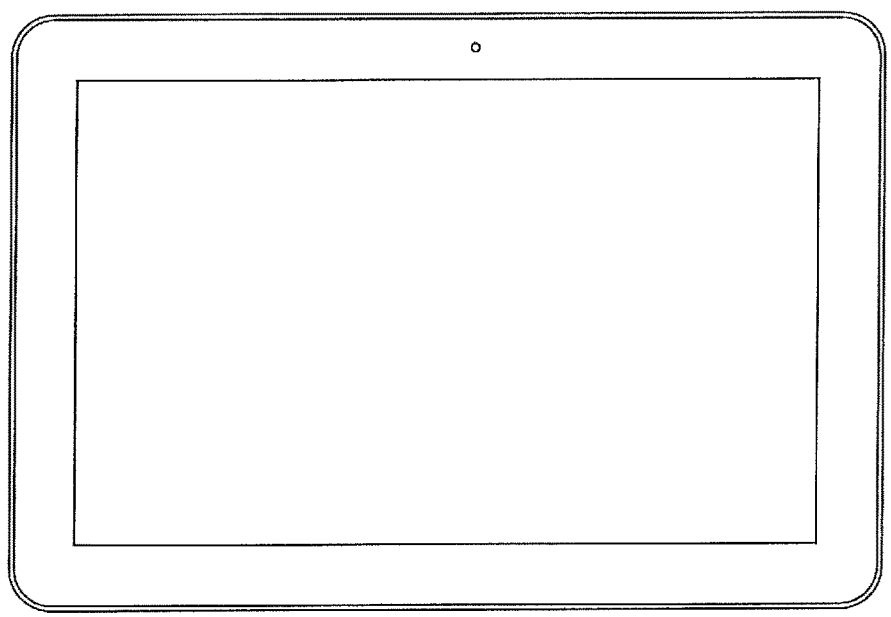
FIGS. 22 to 24 illustrate exemplary semiconductor systems which may apply therein a semiconductor device according to aspects of the present inventive concepts.
Figure 23:
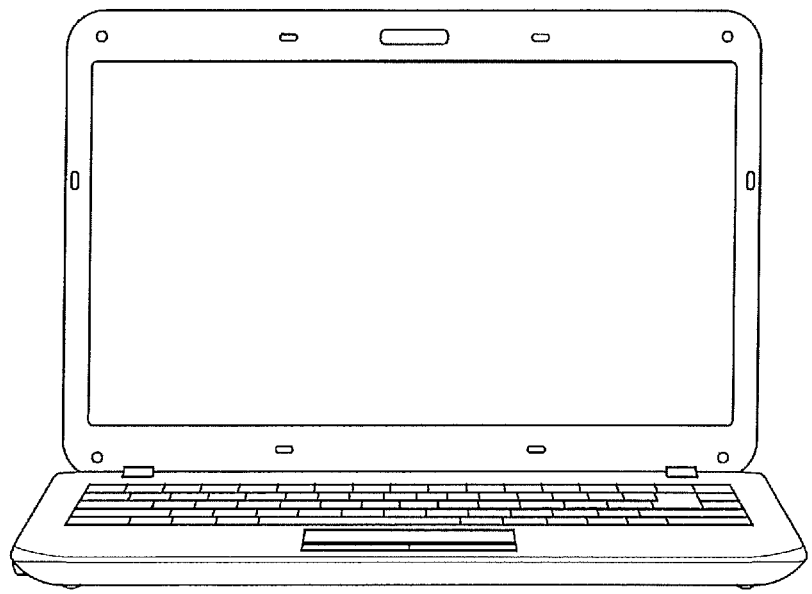
Figure 24:
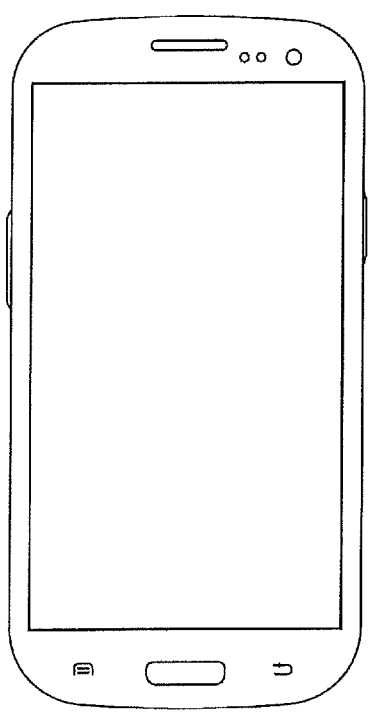

FIGS. 22 to 24 illustrate exemplary semiconductor systems which may apply therein a semiconductor device according to exemplary embodiments of the present inventive concepts.

FIG. 22 illustrates a tablet PC 1200, FIG. 23 illustrates a laptop computer 1300, and FIG. 24 illustrates a smartphone 1400. According to the exemplary embodiments explained above, the semiconductor device may be used in these devices, i.e., in the tablet PC 1200, the laptop computer 1300 or the smartphone 1400.

Further, it is apparent to those skilled in the art that the semiconductor device according to exemplary embodiments is applicable to another integrated circuit device not illustrated herein.

That is, while the tablet PC 1200, the laptop computer 1300 and the smartphone 1400 are exemplified herein as a semiconductor system according to the exemplary embodiments; the exemplary embodiments of the semiconductor system are not limited to any of the examples given above.

In some exemplary embodiments, the semiconductor system may be realized as a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, or a digital video player.

Hereinbelow, a method for fabricating a semiconductor device according to an exemplary embodiment of the present inventive concepts is be explained with reference to FIGS. 25 to 33. FIGS. 25 to 33 are schematic diagram views illustrating intermediate stages of fabrication, illustrating a method for fabricating a semiconductor device according to an exemplary embodiment of the present inventive concepts. In the following description, those elements in common with the semiconductor devices 1-9 already described above will not be described or described as brief as possible for the sake of brevity.

Figure 25:
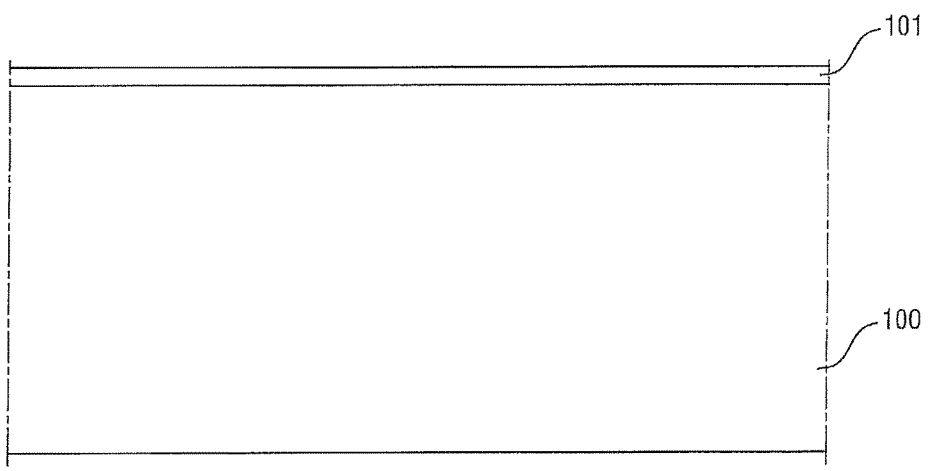
FIGS. 25 to 33 are schematic diagram views illustrating intermediate stages of fabrication according to an exemplary embodiment of the present inventive concepts.

Referring first to FIG. 25, a surface layer 101 is formed on the substrate 100. The surface layer 101 is formed conformally on the upper surface of the substrate 100. The surface layer 101 later may act as an etch-stop layer. However, exemplary embodiments are not limited to the example given above.

Figure 26:
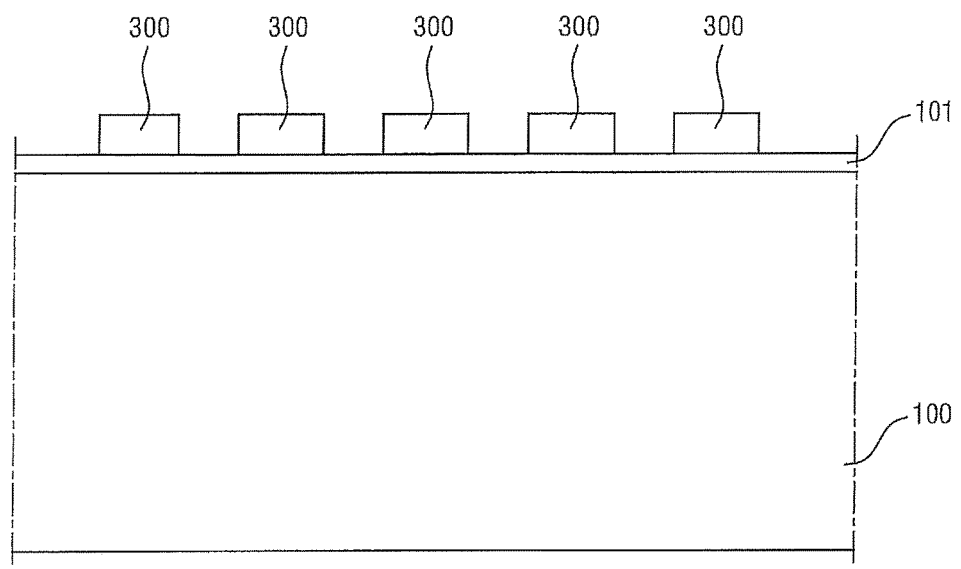

Referring to FIG. 26, a mask pattern 300 is formed on the surface layer 101. The mask pattern 300 may be formed along the surface layer 101, except for the portions where the fin-type pattern will be later formed. In this embodiment, mask pattern 300 is a plurality of spaced patterns.

Figure 27:
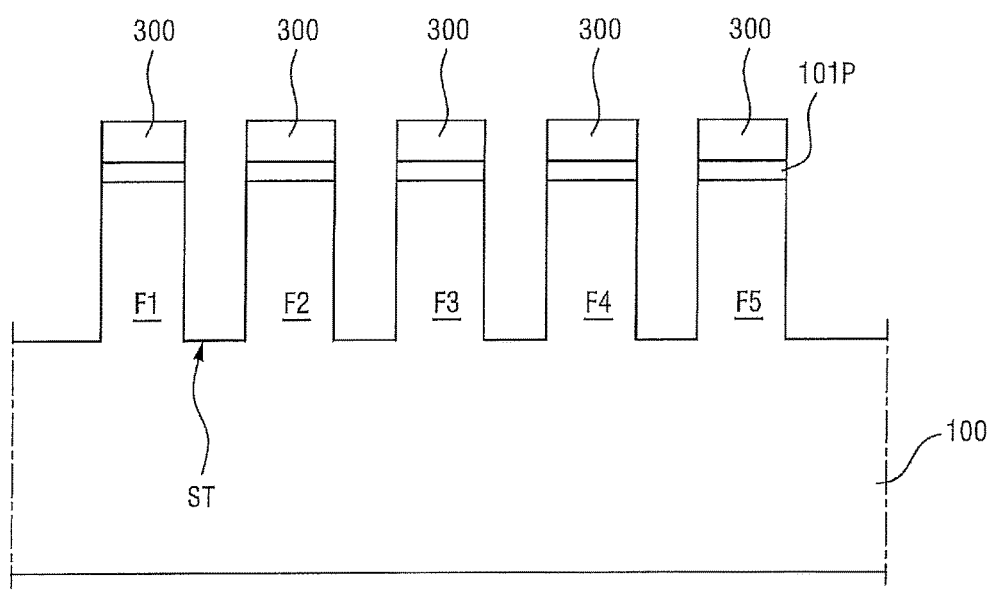

Referring to FIG. 27, portions of the surface layer 101 and the substrate 100 are removed using the mask pattern 300 as a mask. At this time, the shallow trench ST is formed, as the substrate 100 is etched. Further, the fin-type patterns F1-F5 are formed, as defined by the shallow trench ST. A surface layer pattern 101P remains on the upper surface of the fin-type patterns F1-F5.

Figure 28:
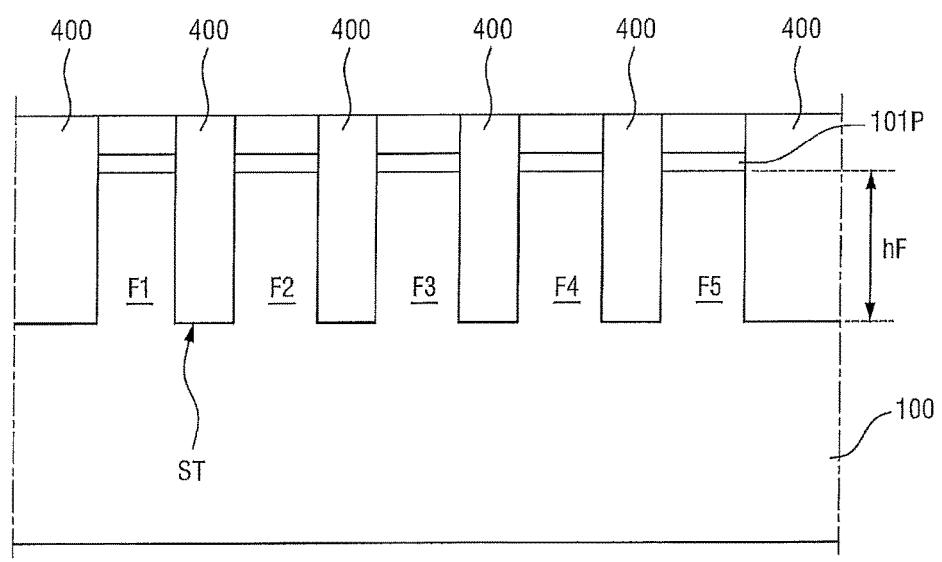

Referring to FIG. 28, a device-isolating layer 400 is formed, filling each shallow trench ST.

Forming the device isolating layer 400 includes filling each shallow trench ST, forming an insulating layer to cover the mask pattern 300, and exposing the mask pattern 300 again, by partially removing the insulating layer with a planarization process. The height hF of the fin-type patterns F1-F5 is less than the height of the device-isolating layer 400.

Figure 29:
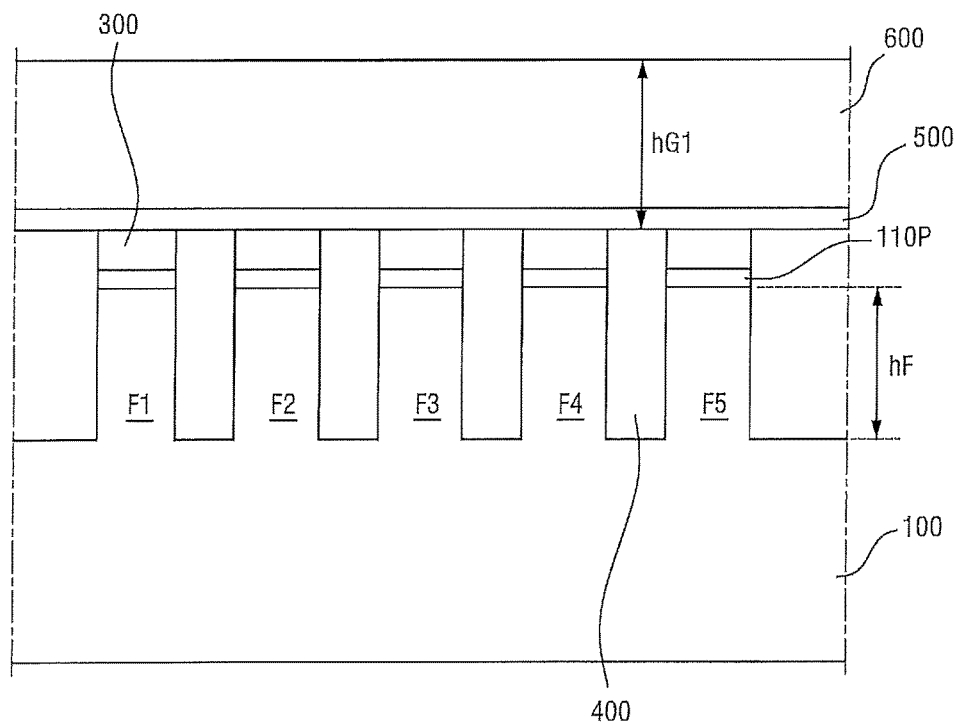

Referring to FIG. 29, an oxide thin film 500 and a stopper layer 600 may be formed on the mask pattern 300 and the device-isolating layer 400.

The oxide thin film 500 is formed conformally on the mask pattern 300 and the device isolating layer 400. The oxide thin film 500 may include an oxide and is be formed into a very thin thickness, e.g., into 30 Å(angstrom), but not limited thereto.

A stopper layer 600 is then formed conformally on the oxide thin film 500. The stopper layer 600 may include SiN, but is not limited thereto. The stopper layer 600 may be formed into a thickness of 200 to 300 Å(angstrom), for example. However, exemplary embodiments are not limited to the example given above.

Figure 30:
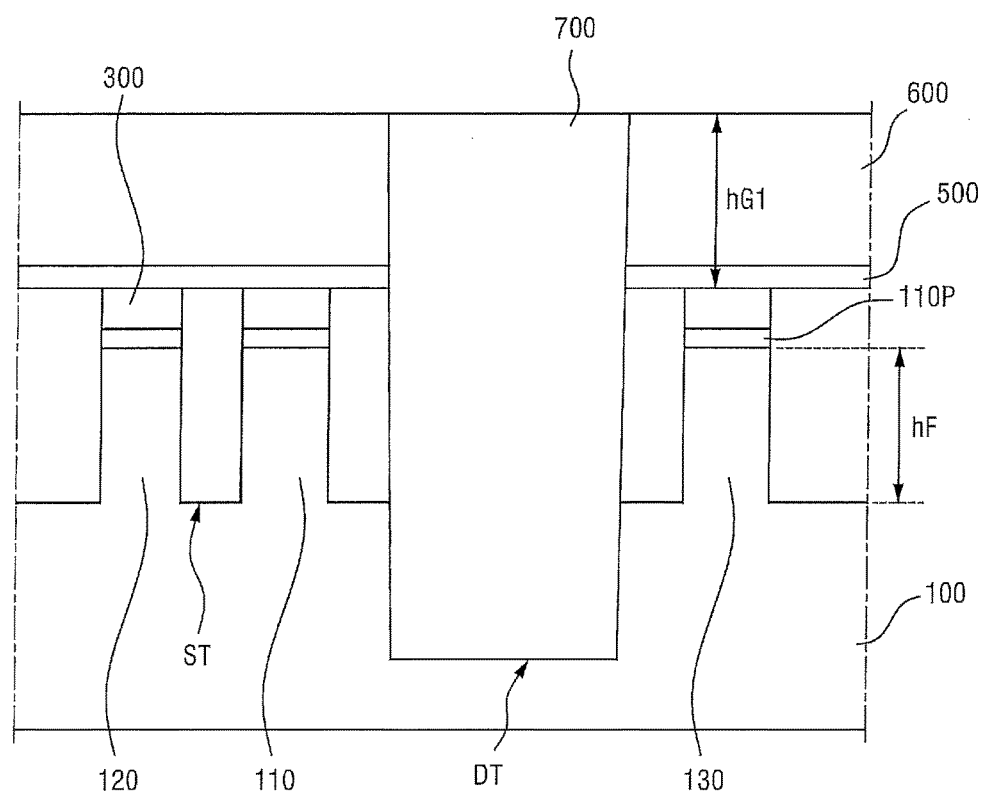

Referring to FIG. 30, the deep trench DT and a large field-insulating layer 700 are formed.

The deep trench DT is formed by partially etching the stopper layer 600, the oxide thin film 500, the device isolating layer 400, certain of the fin-type patterns F1-F5, and the substrate 100. The deep trench DT includes a bottom surface that is lower than that of the shallow trench ST. The deep trench DT includes a width that is greater than that of the shallow trench ST. Portions F3, F4 of the fin-type patterns F1-F5 are removed by the deep trench DT. The remaining fin-type patterns F1, F2 and F5, which are not removed by the deep trench DT, become the first to third fin-type patterns 110, 120 and 130 of the semiconductor device 7.

The deep trench DT has a cross section of the device-isolating layer 400 as its sidewall. That is, a remaining portion after the partial removal of the device-isolating layer 400 serves as the sidewall of the deep trench DT. However, exemplary embodiments are not limited to the examples given above. For example, a remaining portion of the fin-type patterns F1, F2 and F5 after the removal of the fin-type patterns F3 and F4 may serve as the sidewall of the deep trench DT.

The large field-insulating layer 700 fills the deep trench DT and is formed to have an upper surface higher than the device-isolating layer 400 by the sum, hG1, of the heights of the oxide thin film 500 and the stopper layer 600. The large field-insulating layer 700 may include a material same as, or different from that of the device isolating layer 400.

Figure 31:
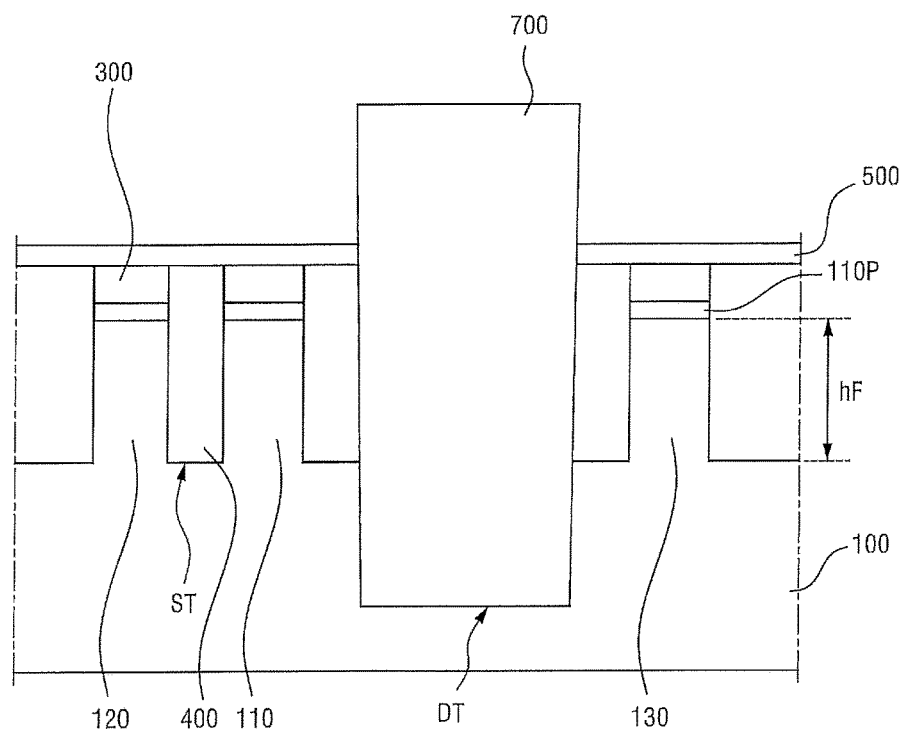

Referring to FIG. 31, the stopper layer 600 is removed. The removal of the stopper layer 600 partially exposes the side surface of the large field-insulating layer 700, as complete removal of the stopper layer 600 exposes the side surface of the large field insulating layer 700 by the thickness of the stopper layer 600.

Figure 32:
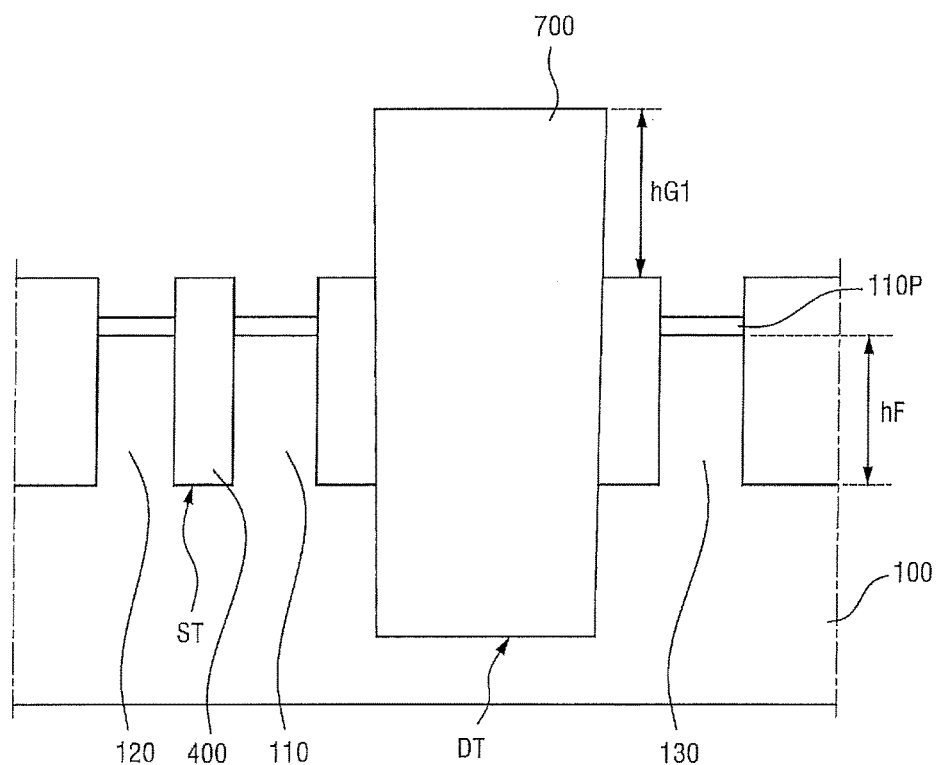

Referring to FIG. 32, the oxide thin film 500 is removed. The removal of the oxide thin film 500 additionally exposes the side surface of the large field-insulating layer 700. The thickness of the exposed side surface of the large field-insulating layer 700 is the thickness hG1 of the oxide thin film 500 and the stopper layer 600.

Figure 33:
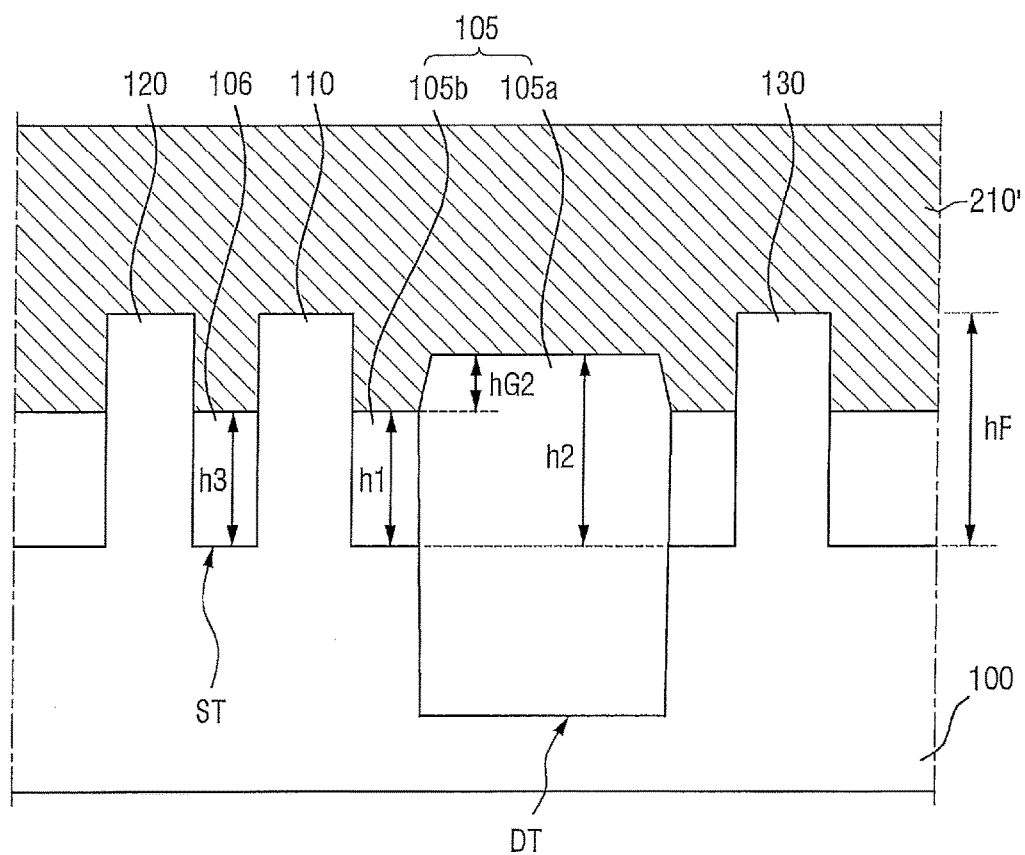

Referring to FIG. 33, the large field-insulating layer 700, the surface layer pattern 101 and the device isolating layer 400 are partially removed, thus forming the first field-insulating layer 106 and the second field-insulating layer 105.

The remaining portion after the partial removal of the device-isolating layer 400 defines the first field-insulating layer 106 and the first region 105a of the second field-insulating layer 105. The remaining portion after the partial removal of the large field-insulating layer 700 defines the second region 105b of the second field-insulating layer 105. The surface layer pattern 101 is completely removed.

Since the upper surface of the large field-insulating layer 700 was higher than the device-isolating layer 400 by a predetermined thickness hG1, the second field-insulating layer 105 has a higher upper surface compared to the first field-insulating layer 106. That is, the height difference hG2 between upper surfaces of the second field insulating layer 105 and the first field insulating layer 106 is a result of the predetermined thickness hG1.

The third height h3 of the first field-insulating layer 106 and the first height h1 and the second height h2 of the second field-insulating layer 105 is less than the height hF of the upper surfaces of the first through third fin-type patterns 110-130.

The first gate electrode 210 is then formed on the first through the third fin-type patterns 110-130, the first field-insulating layer 106 and the second field-insulating layer

105. Forming the first gate electrode 210 includes first, forming the first gate electrode layer, and then planarizing the upper surface of the first gate electrode 210 by planarizing the upper surface of the first gate electrode layer.

Figure 34:
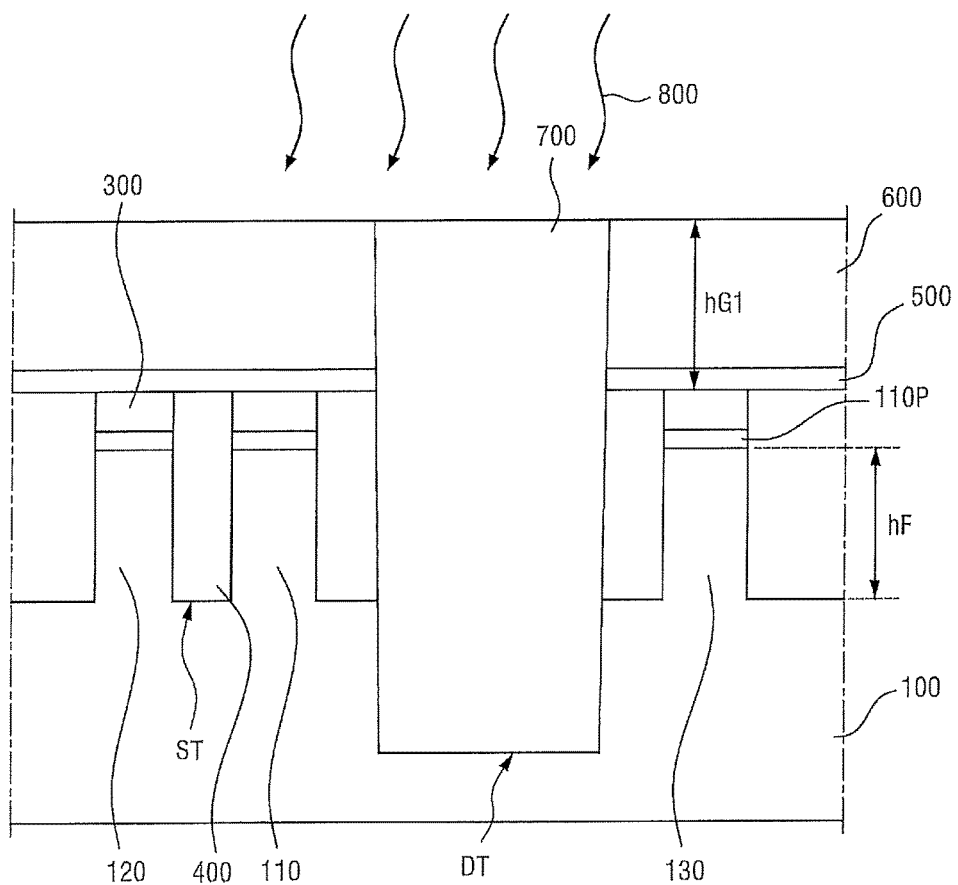
FIG. 34 is a schematic diagram view illustrating an intermediate stage of fabrication according to another exemplary embodiment of the present inventive concepts.

Hereinbelow, a method for fabricating a semiconductor device according to another exemplary embodiment of the present inventive concepts is explained with reference to FIG. 34. FIG. 34 is a schematic diagram view illustrating an intermediate stage of fabrication, illustrating a method for fabricating a semiconductor device according to another exemplary embodiment. In the following description, those elements in common with the fabricating method of the semiconductor device already described above will not be described or described as brief as possible for the sake of brevity.

Referring to FIG. 34, a fabricating method of semiconductor device according to another exemplary embodiments involves forming a deep trench DT and a large field-insulating layer 700, and then annealing 800 the surface of the large field-insulating layer 700.

The large field-insulating layer 700 may be oxide-based insulator film, and the stopper layer 600 may be nitride-based insulator film The annealing process 800 may be oxide surface treatment. Accordingly, while the effect of the annealing 800 on the stopper layer 600 is negligible, the silicon content of the large field-insulating layer 700 may be altered by the surface treatment. Accordingly, as the etch rate of the large field-insulating layer 700 is further decreased in the subsequent etching process, the second field insulating layer 105 with a relatively increased height can be formed.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device, comprising:
   a first fin-type pattern on a substrate, comprising a first sidewall and a second sidewall opposed to each other;
   a first trench formed in contact with the first sidewall;
   a second trench formed in contact with the second sidewall;
   a first field-insulating layer partially filling the first trench;
   a second field-insulating layer partially filling the second trench, and comprising a first region and a second region disposed in a sequential order starting from the second sidewall, an upper surface of the second region being higher than an upper surface of the first field-insulating layer; and
   a gate electrode on the first fin-type pattern, the first field-insulating layer and the second field-insulating layer, the gate electrode intersecting the first fin-type pattern and overlapping the second region.

2. The semiconductor device of claim 1, wherein a contact between the upper surface of the first region of the second field-insulating layer and the first fin-type pattern is lower than the upper surface of the second region of the second field-insulating layer.

3. The semiconductor device of claim 1, wherein the second field-insulating layer further comprises a third region in contact with the second region, and an upper surface of the third region is lower than the upper surface of the second region.

4. The semiconductor device of claim 1, wherein a bottom surface of the first region is higher than a bottom surface of the second region.

5. The semiconductor device of claim 1, wherein a width of the second region is greater than a width of the first region.

6. The semiconductor device of claim 1, wherein the upper surface of the second region is higher than the upper surface of the first region.

7. The semiconductor device of claim 1, wherein an uppermost portion of the upper surface of the second field-insulating layer is located at the second region.

8. The semiconductor device of claim 1, further comprising a second fin-type pattern in contact with the second field-insulating layer, and in an opposite direction from the first fin-type pattern with reference to the second field-insulating layer.

9. The semiconductor device of claim 1, wherein the upper surface of the first fin-type pattern is lower than an uppermost portion of the upper surface of the second field-insulating layer.

10. A semiconductor device, comprising:
    a first and a second fin-type patterns spaced from each other;
    a first trench between the first and the second fin-type patterns, spacing the first and the second fin-type patterns from each other;
    a field-insulating layer formed within the first trench, in contact with sidewalls of the first and the second fin-type patterns, respectively; and
    a gate electrode formed on the first fin-type pattern, the second fin-type pattern, and the insulating layer,
    wherein the field-insulating layer comprises a first region and a second region, and
    an upper surface of the first region is lower than an upper surface of the second region.

11. The semiconductor device of claim 10, wherein the first region is disposed on both sides of the second region, the first region is in contact with the first fin-type pattern and the second fin-type pattern, and the second region is not in contact with the first and the second fin-type patterns.

12. The semiconductor device of claim 10, wherein a thickness of the gate electrode overlapping the second region is less than a thickness of the gate electrode overlapping the first region.

13. The semiconductor device of claim 10, wherein a contact between the upper surface of the field-insulating layer and the first fin-type pattern is higher than a portion of the upper surface of the first region.

14. The semiconductor device of claim 10, further comprising a second trench formed in an opposite direction from the first trench with reference to the first fin-type pattern.

15. The semiconductor device of claim 10, wherein a bottom surface of the first region is higher than a bottom surface of the second region.

16. A semiconductor device, comprising:
    first, second and third fin-type patterns spaced from each other;
    a first trench between the first and the second fin-type patterns, spacing the first and the second fin-type patterns from each other;
    a second trench between the second and the third fin-type patterns, spacing the second and the third fin-type patterns from each other;

a first field-insulating layer partially filling the first trench;

a second field-insulating layer partially filling the second trench; and a gate electrode formed on the first fin-type pattern, the second fin-type pattern, and the first and the second field-insulating layers, wherein a first region of a lower surface of the gate electrode that overlaps the first field-insulating layer, is higher than a second region overlapping the second field-insulating layer.

17. The semiconductor device of claim 16, wherein a width of the first trench is greater than a width of the second trench.

18. The semiconductor device of claim 16, wherein a gap between the first and the second fin-type patterns is wider than a gap between the second and the third fin-type patterns.

19. The semiconductor device of claim 16, wherein an uppermost portion of the lower surface of the gate electrode is located at the first region.

20. The semiconductor device of claim 16, wherein the gate electrode is a single integrated structure.

* * * * *